(12) United States Patent
Hu et al.

(10) Patent No.: US 11,930,665 B2
(45) Date of Patent: Mar. 12, 2024

(54) DISPLAY SUBSTRATE AND MANUFACTURING METHOD THEREOF, AND DISPLAY APPARATUS

(71) Applicants: MIANYANG BOE OPTOELECTRONICS TECHNOLOGY CO.,LTD., Sichuan (CN); BOE TECHNOLOGY GROUP CO., LTD., Beijing (CN)

(72) Inventors: Yong Hu, Beijing (CN); Zerui Zhang, Beijing (CN); Dali Li, Beijing (CN); Xin Luo, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,543

(22) PCT Filed: Jul. 30, 2021

(86) PCT No.: PCT/CN2021/109730
§ 371 (c)(1),
(2) Date: Jun. 28, 2022

(87) PCT Pub. No.: WO2022/160635
PCT Pub. Date: Aug. 4, 2022

(65) Prior Publication Data
US 2023/0345793 A1    Oct. 26, 2023

(30) Foreign Application Priority Data
Jan. 28, 2021 (CN) .......................... 202110121161.6

(51) Int. Cl.
*G06F 3/041* (2006.01)
*G06F 3/044* (2006.01)
(Continued)

(52) U.S. Cl.
CPC ....... *H10K 59/1213* (2023.02); *G06F 3/0412* (2013.01); *G06F 3/0446* (2019.05);
(Continued)

(58) Field of Classification Search
None
See application file for complete search history.

(56) References Cited

U.S. PATENT DOCUMENTS

2019/0006431 A1* 1/2019 Won ...................... G06F 3/0443
2020/0381653 A1* 12/2020 Bang .................... H10K 50/844
(Continued)

FOREIGN PATENT DOCUMENTS

CN    211350693 U    8/2020
CN    111798759 A    10/2020
(Continued)

OTHER PUBLICATIONS

PCT International Search Report (w/ English translation) and Written Opinion for corresponding PCT Application No. PCT/CN2021/109730, dated Nov. 5, 2021, 8 pages.
(Continued)

*Primary Examiner* — Nicholas J Lee
(74) *Attorney, Agent, or Firm* — Dority & Manning, P.A.

(57) ABSTRACT

A display substrate has a display region and a peripheral region. The display substrate includes a substrate, a first dam, a second dam and a connection portion. The first dam and the second dam are located on a side of the substrate, and are located in the peripheral region. The second dam is farther from the display region than the first dam. A height of the second dam is greater than a height of the first dam.

(Continued)

The connection portion is located between the first dam and the second dam. The connection portion connects the first dam and the second dam, and a height of the connection portion is less than the height of the first dam. At least a portion of the first dam, at least a portion of the connection portion and at least a portion of the second dam are of an integrative structure.

18 Claims, 7 Drawing Sheets

(51) Int. Cl.
| | |
|---|---|
| *H10K 50/844* | (2023.01) |
| *H10K 59/12* | (2023.01) |
| *H10K 59/121* | (2023.01) |
| *H10K 59/122* | (2023.01) |
| *H10K 59/123* | (2023.01) |
| *H10K 59/124* | (2023.01) |
| *H10K 59/131* | (2023.01) |
| *H10K 59/80* | (2023.01) |
| *H10K 71/00* | (2023.01) |
| *H01L 27/12* | (2006.01) |
| *H10K 59/40* | (2023.01) |

(52) U.S. Cl.
CPC ....... *H10K 50/844* (2023.02); *H10K 59/1201* (2023.02); *H10K 59/1216* (2023.02); *H10K 59/122* (2023.02); *H10K 59/123* (2023.02); *H10K 59/124* (2023.02); *H10K 59/131* (2023.02); *H10K 59/873* (2023.02); *H10K 71/00* (2023.02); *G06F 3/04164* (2019.05); *H01L 27/1255* (2013.01); *H10K 59/40* (2023.02)

(56) References Cited

U.S. PATENT DOCUMENTS

2022/0130937 A1* 4/2022 Zhao ................... H10K 59/131
2022/0320240 A1   10/2022 Bao et al.

FOREIGN PATENT DOCUMENTS

| CN | 112018159 A | 12/2020 |
| CN | 112018161 A | 12/2020 |
| CN | 112233559 A | 1/2021 |

OTHER PUBLICATIONS

Ex Parte Quayle Action received in corresponding U.S. Appl. No. 17/459,319, dated Jul. 24, 2023, 8 pages.

* cited by examiner

DISPLAY SUBSTRATE AND MANUFACTURING METHOD THEREOF, AND DISPLAY APPARATUS

CROSS-REFERENCE TO RELATED APPLICATIONS

This application is a national phase entry under 35 USC 371 of International Patent Application No. PCT/CN 2021/109730 filed on Jul. 30, 2021, which claims priority to Chinese Patent Application No. 202110121161.6, filed on Jan. 28, 2021, which are incorporated herein by reference in their entirety.

TECHNICAL FIELD

The present disclosure relates to the field of display technologies, and in particular, to a display substrate and a manufacturing method thereof, and a display apparatus.

BACKGROUND

With the continuous development of science and technology, users have increasingly high pursuits for a screen-to-body ratio of a display apparatus (i.e., a ratio of an area of a display screen to an area of a front panel of the display apparatus). Therefore, a concept of full screen appears. For example, optical devices such as image collector(s) and camera(s) in the display apparatus are provided below the display screen, so as to increase the ratio of the area of the display screen to the area of the front panel of the display apparatus, and make the ratio approach 100%.

SUMMARY

In an aspect, a display substrate is provided. The display substrate has a display region and a peripheral region. The display substrate includes a substrate, a first dam, a second dam and a connection portion. The first dam and the second dam are located on a side of the substrate and located in the peripheral region. The second dam is farther from the display region than the first dam, and a height of the second dam is greater than a height of the first dam. The connection portion is located between the first dam and the second dam. The connection portion connects the first dam and the second dam, and a height of the connection portion is less than the height of the first dam. At least a portion of the first dam, at least a portion of the connection portion and at least a portion of the second dam are of an integrative structure.

In some embodiments, the first dam includes a plurality of first blocking layers that are stacked in sequence, and the second dam includes a plurality of second blocking layers that are stacked in sequence. A total number of the second blocking layers is greater than a total number of the first blocking layers. The connection portion includes one or more connection layers, and a total number of the one or more connection layers is less than the total number of the first blocking layers.

In some embodiments, at least one of the plurality of first blocking layers proximate to the substrate and at least one of the plurality of second blocking layers proximate to the substrate are connected through at least one connection layer.

In some embodiments, a connection layer of the one or more connection layers connects a first blocking layer of the plurality of first blocking layers and a second blocking layer of the plurality of second blocking layers.

In some embodiments, a side wall of the first dam proximate to the display region has a side proximate to the substrate and a side away from the substrate that is farther the display region than the side proximate to the substrate, and the side wall is in one of a slope shape and a step shape. A portion, unconnected to the connection portion, of a side wall of the first dam away from the display region has a side proximate to the substrate and a side away from the substrate that is closer to the display region than the side proximate to the substrate, and the portion is in one of a slope shape and a step shape.

In some embodiments, a portion, unconnected to the connection portion, of a side wall of the second dam proximate to the display region has a side proximate to the substrate and a side away from the substrate that is farther from the display region than the side proximate to the substrate, and the portion is in one of a slope shape and a step shape. A side wall of the second dam away from the display region has a side proximate to the substrate and a side away from the substrate that is closer to the display region than the side proximate to the substrate, and the side wall is in one of a slope shape and a step shape.

In some embodiments, a slope of a portion, unconnected to the connection portion, of a side wall of the first dam away from the display region is less than a slope of a portion, unconnected to the connection portion, of a side wall of the second dam proximate to the display region.

In some embodiments, a slope of a side wall of the first dam proximate to the display region is less than a slope of a side wall of the second dam away from the display region.

In some embodiments, the display region includes a main display region and an auxiliary display region. A light transmittance of a portion of the display substrate located in the auxiliary display region is greater than a light transmittance of a portion of the display substrate located in the main display region.

In some embodiments, the display substrate further includes a plurality of first sub-pixels and a plurality of second sub-pixels that are all disposed on the side of the substrate. The plurality of first sub-pixels are located in the main display region. Each second sub-pixel includes a pixel driving circuit and a light-emitting device. The light-emitting device is disposed on a side of the pixel driving circuit away from the substrate, and is located in the auxiliary display region. The light-emitting device is coupled to the pixel driving circuit. At least one pixel driving circuit in the plurality of second sub-pixels is located outside the auxiliary display region.

In some embodiments, the display substrate further includes a plurality of planarization layers disposed between the pixel driving circuit and the light-emitting device and stacked in sequence. At least one first blocking layer in the plurality of first blocking layers other than one or two first blocking layers farthest from the substrate each is arranged in a same layer as a respective planarization layer in part of the plurality of planarization layers; and/or second blocking layers in the plurality of second blocking layers other than one or two second blocking layers farthest from the substrate each are arranged in another same layer as a respective planarization layer in all of the plurality of planarization layers.

In some embodiments, the display substrate further includes at least one conductive line layer including at least one light-transmitting conductive line. A pixel driving circuit in the at least one pixel driving circuit located in the peripheral region is coupled to a corresponding light-emitting device through a light-transmitting conductive line. At least one of the planarization layers is disposed between the entire at least one conductive line layer and the pixel driving circuit in each second sub-pixel, and another at least one of the planarization layers is disposed between the entire at least one conductive line layer and the light-emitting device.

In some embodiments, the at least one conductive line layer includes at least two conductive line layers, and yet another at least one of the planarization layers is disposed between two adjacent conductive line layers.

In some embodiments, the planarization layer between the entire at least one conductive line layer and the pixel driving circuit in each second sub-pixel includes at least one first planarization layer. In a case where the first planarization layer includes one first planarization layer, the plurality of first blocking layers include a first first blocking layer arranged in a same layer as the first planarization layer, the plurality of second blocking layers include a first second blocking layer arranged in the same layer as the first planarization layer, and the at least one connection layer includes a first connection layer. The first connection layer connects the first first blocking layer and the first second blocking layer.

In some embodiments, in a case where the first planarization layer includes two first planarization layers, the plurality of first blocking layers include a first first blocking layer arranged in a same layer as one first planarization layer of the two first planarization layers and a second first blocking layer arranged in another same layer as another first planarization layer of the two first planarization layers, the plurality of second blocking layers include a first second blocking layer arranged in the same layer as the one first planarization layer and a second second blocking layer arranged in the another same layer as the another first planarization layer, and the at least one connection layer includes a first connection layer and a second connection layer. The first connection layer connects the first first blocking layer and the first second blocking layer. The second connection layer connects the second first blocking layer and the second second blocking layer.

In some embodiments, the first planarization layer includes the two first planarization layers. The at least one conductive line layer includes three conductive line layers. A planarization layer in the plurality of planarization layers is disposed between two adjacent conductive line layers of the three conductive line layers proximate to the substrate, and is a first second planarization layer. Another planarization layer in the plurality of planarization layers is disposed between two adjacent conductive line layers of the three conductive line layers away from the substrate, and is a second second planarization layer. The plurality of first blocking layers further include a third first blocking layer arranged in yet another same layer as the first second planarization layer, and a fourth first blocking layer arranged in yet another same layer as the second second planarization layer. The plurality of second blocking layers further include a third second blocking layer arranged in the yet another same layer as the first second planarization layer, and a fourth second blocking layer arranged in the yet another same layer as the second second planarization layer.

In some embodiments, the at least one connection layer further includes a third connection layer and a fourth connection layer. The third connection layer connects the third first blocking layer and the third second blocking layer, and the fourth connection layer connects the fourth first blocking layer and the fourth second blocking layer.

In some embodiments, the at least one connection layer further includes a third connection layer. The third connection layer connects the third first blocking layer and the third second blocking layer. The fourth first blocking layer is unconnected to the fourth second blocking layer.

In some embodiments, the display substrate further includes a pixel defining layer disposed on a side of the plurality of planarization layers away from the substrate, and a plurality of support pads disposed on a surface of the pixel defining layer away from the substrate. A first blocking layer in the plurality of first blocking layers farthest from the substrate is arranged in a same layer as the pixel defining layer, and a second blocking layer in the plurality of second blocking layers farthest from the substrate is arranged in the same layer as the pixel defining layer or arranged in another same layer as the plurality of support pads; or a first blocking layer in the plurality of first blocking layers farthest from the substrate is arranged in a same layer as the plurality of support pads, and a second blocking layer in the plurality of second blocking layers farthest from the substrate is arranged in the same layer as the plurality of support pads or arranged in another same layer as the pixel defining layer.

In some embodiments, in a case where the first blocking layer in the plurality of first blocking layers farthest from the substrate is arranged in a same layer as the plurality of support pads, a first blocking layer in the plurality of first blocking layers second farthest from the substrate is arranged in a same layer as the pixel defining layer. In a case where the second blocking layer in the plurality of second blocking layers farthest from the substrate is arranged in the same layer as the plurality of support pads, a second blocking layer in the plurality of second blocking layers second farthest from the substrate is arranged in the same layer as the pixel defining layer.

In some embodiments, the plurality of first blocking layers further include a fifth first blocking layer arranged in the same layer as the pixel defining layer or the plurality of support pads. The planarization layer between the entire at least one conductive line layer and the light-emitting device includes at least one third planarization layer, and the third planarization layer includes one third planarization layer. The plurality of second blocking layers further include a fifth second blocking layer arranged in yet another same layer as the third planarization layer, and a sixth second blocking layer arranged in the same layer as the pixel defining layer or the plurality of support pads. The fifth second blocking layer and the sixth second blocking layer are unconnected to the fifth first blocking layer.

In some embodiments, the display substrate further includes a barrier layer. An end of the barrier layer extends between two adjacent first blocking layers, and another end of the barrier layer extends between two adjacent planarization layers. A first blocking layer in the two adjacent first blocking layers on which the end of the barrier layer is lapped is arranged in a same layer as a planarization layer in the two adjacent planarization layers on which the another end of the barrier layer is lapped.

In some embodiments, an orthographic projection, on the substrate, of the first blocking layer on which the end of the barrier layer is lapped and an orthographic projection, on the substrate, of another planarization layer in the two adjacent planarization layers located on a side of the another end of the barrier layer away from the substrate are overlapped with each other, or have respective edges that are overlapped with each other.

In some embodiments, in a case where the display substrate further includes the at least one conductive line layer, the barrier layer is arranged in a same layer as one of the at least one conductive line layer.

In some embodiments, the display substrate further includes an encapsulation layer disposed on a side of the plurality of first sub-pixels and the plurality of second sub-pixels away from the substrate. The encapsulation layer is configured to encapsulate the plurality of first sub-pixels and the plurality of second sub-pixels on the substrate. The encapsulation layer includes: a first inorganic layer; an organic layer disposed on a side of the first inorganic layer away from the substrate; and a second inorganic layer disposed on a side of the organic layer away from the substrate. The second dam is configured to confine the organic layer to a region surrounded thereby. The first inorganic layer covers the first dam and the second dam, and the second inorganic layer covers the first dam and the second dam.

In some embodiments, the at least one connection layer includes a plurality of connection layers. A first blocking layer in the plurality of first blocking layers closest to the substrate and a second blocking layer in the plurality of second blocking layers closest to the substrate are connected through a connection layer in the plurality of connection layers to form a first communication portion. A first blocking layer in the plurality of first blocking layers second closest to the substrate and a second blocking layer in the plurality of second blocking layers second closest to the substrate are connected through another connection layer in the plurality of connection layers to form a second communication portion. The display substrate further includes a voltage signal line disposed on the side of the substrate. The voltage signal line is located in the peripheral region and arranged around the display region. A portion of the voltage signal line away from the display region is located between the first communication portion and the second communication portion. An orthographic projection of an edge of the voltage signal line away from the display region on the substrate is located between an orthographic projection of an edge of the first communication portion proximate to the display region on the substrate and an orthographic projection of an edge of the first communication portion away from the display region on the substrate.

In some embodiments, the plurality of first blocking layers are arranged in at least one of following manners: a first blocking layer in the plurality of first blocking layers farthest from the substrate covers a side surface, facing the second dam, of a first blocking layer in the plurality of first blocking layers second farthest from the substrate; or the first blocking layer in the plurality of first blocking layers second farthest from the substrate covers a side surface, facing the second dam, of a first blocking layer in the plurality of first blocking layers third farthest from the substrate.

In some embodiments, the plurality of second blocking layers are arranged in at least one of following manners: a second blocking layer in the plurality of second blocking layers farthest from the substrate covers a side surface, facing the first dam, of a second blocking layer in the plurality of second blocking layers second farthest from the substrate; or the second blocking layer in the plurality of second blocking layers second farthest from the substrate covers a side surface, facing the first dam, of a second blocking layer in the plurality of second blocking layers third farthest from the substrate; or the second blocking layer in the plurality of second blocking layers third farthest from the substrate covers a side surface, facing the first dam, of a second blocking layer in the plurality of second blocking layers fourth farthest from the substrate.

In some embodiments, a connection layer in the one or more connection layers is arranged in a same layer as a first blocking layer in the plurality of first blocking layers and a second blocking layer in the plurality of second blocking layers that are connected to the connection layer.

In another aspect, a manufacturing method of a display substrate is provided. The display substrate has a display region and a peripheral region. The manufacturing method includes: providing a substrate; forming a first dam, a connection portion and a second dam that are located in the peripheral region and away from the display region in sequence on a side of the substrate. A height of the second dam is greater than a height of the first dam, and a height of the connection portion is less than the height of the first dam. At least a portion of the first dam, at least a portion of the connection portion and at least a portion of the second dam are of an integrative structure.

In some embodiments, the first dam includes a plurality of first blocking layers that are stacked in sequence, and the second dam includes a plurality of second blocking layers that are stacked in sequence. A total number of the second blocking layers is greater than a total number of the first blocking layers. The connection portion includes one or more connection layers, and a total number of the one or more connection layers is less than the total number of the first blocking layers. At least one of the plurality of first blocking layers proximate to the substrate and at least one of the plurality of second blocking layers proximate to the substrate are connected through at least one connection layer. A connection layer in the one or more connection layers connects a first blocking layer in the plurality of first blocking layers and a second blocking layer in the plurality of second blocking layers. The connection layer, and the first blocking layer and the second blocking layer that are connected to the connection layer are formed through a same patterning process.

In yet another aspect, a display apparatus is provided. The display apparatus includes the display substrate in any one of the above embodiments.

In some embodiments, the peripheral region of the display substrate includes a bonding region, and the bonding region is located on a side of the second dam away from the display region. The display apparatus further includes: a touch driver chip located in the bonding region of the display substrate; a touch grid structure located in the display region of the display substrate; and a plurality of signal transmission lines connecting the touch driver chip and the touch grid structure. The plurality of signal transmission lines are located on a side of the first dam and the second dam away from the substrate. Orthographic projections of the plurality of signal transmission lines on the substrate are each partially overlapped with an orthographic projection of the connection portion on the substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled," "connected," and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "perpendicular to" or "equal to" includes a stated condition and condition(s) similar to the stated condition. The similar condition(s) are within an acceptable range of deviation, and the acceptable range of deviation is determined by a person of ordinary skill in the art, considering measurement in question and errors associated with measurement of a particular quantity (i.e., limitations of a measurement system). For example, the term "perpendicular to" includes an absolute perpendicularity and an approximate perpendicularity, and for the approximate perpendicularity, an acceptable range of deviation may be, for example, within 5 degrees. The term "equal to" includes an absolute equality and an approximate equality, and for the approximate equality, an acceptable range of deviation may be that, for example, a difference between two that are equal to each other is less than or equal to 5% of any one of the two.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 2:
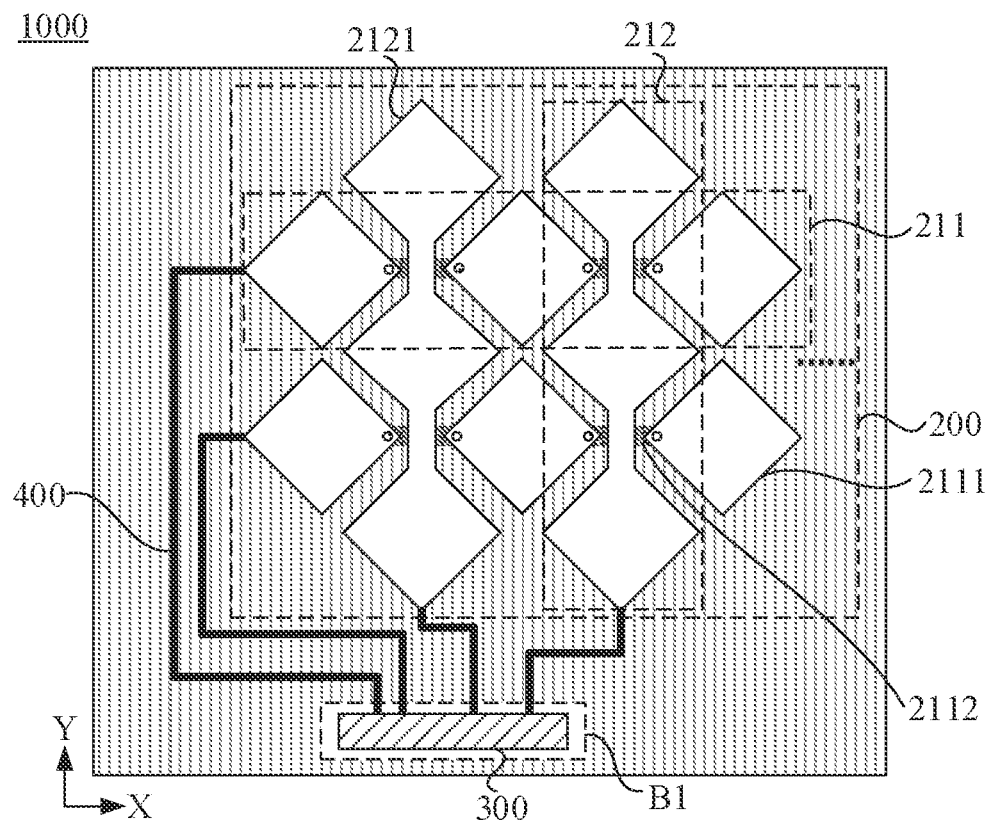
FIG. 2 is a structural diagram of another display apparatus, in accordance with some embodiments of the present disclosure.
Figure 3:
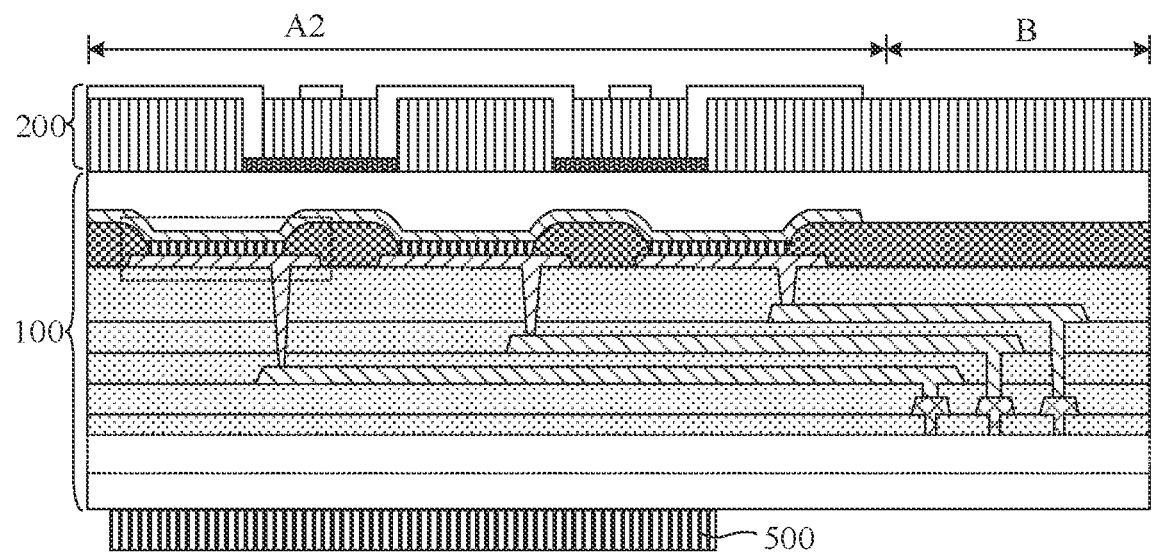
FIG. 3 is a partial structural diagram of a display apparatus, in accordance with some embodiments of the present disclosure.

Referring to FIG. 1, some embodiments of the present disclosure provide a display apparatus 1000. Referring to FIGS. 2 and 3, the display apparatus 1000 includes a display substrate 100, a touch grid structure 200, a touch driver chip 300, and a plurality of signal transmission lines 400.

In some examples, referring to FIGS. 1 and 3, the display apparatus 1000 further includes an optical device 500.

It will be noted that a type of the optical device 500 varies, and may be set according to actual needs. For example, the optical device 500 may be a camera, an infrared receiver, or an infrared transmitter.

Figure 4:
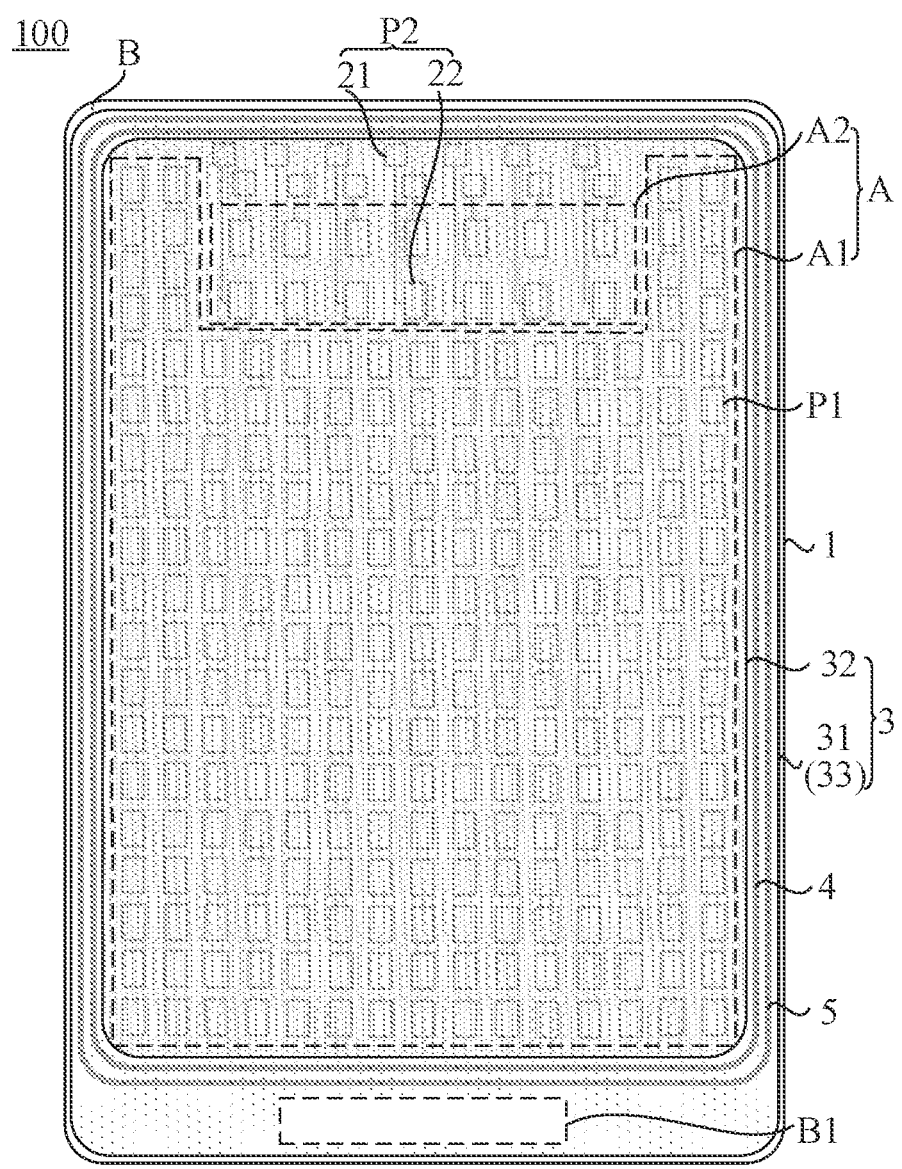
FIG. 4 is a structural diagram of a display substrate, in accordance with some embodiments of the present disclosure.

In some examples, referring to FIG. 4, the display substrate 100 has a display region A and a peripheral region B, A portion of the display substrate 100 located in the display region A is able to display image(s).

It will be noted that an arrangement position of the peripheral region B is not limited. For example, the peripheral region B may be located on a side, two sides, or three sides of the display region A. For another example, the peripheral region B may also be located on a periphery of the display region A.

In some examples, referring to FIG. 4 again, the display region A includes a main display region A1 and auxiliary display region(s) A2. For example, an area of the main display region A1 may be greater than an area of the auxiliary display region A2.

It will be noted that the number of the auxiliary display region(s) A2 may be one or more, and may be specifically set according to actual needs. A positional relationship between the main display region A1 and the auxiliary display region A2 varies, and may be set according to actual needs.

For example, referring to FIG. 4 again, the auxiliary display region A2 is located beside the main display region A1. That is, part of a border of the auxiliary display region A2 is overlapped with part of a border of the main display region A1. In this case, the auxiliary display region A2 may have, for example, a rectangular shape, a rectangular shape with rounded corners, a water drop shape, or a semicircular shape.

For example, the main display region A1 may be located on a periphery of the auxiliary display region A2. That is, the main display region A1 surrounds the auxiliary display region A2. In this case, the auxiliary display region A2 may have, for example, a circular shape, an elliptical shape, or a rectangular shape.

In some examples, a light transmittance of a portion of the display substrate 100 located in the auxiliary display region A2 is greater than a light transmittance of a portion of the display substrate 100 located in the main display region A1. In this design, in a process of external light passing through the portion of the display substrate 100 located in the auxiliary display region A2 and reaching the optical device 500 to make the optical device 500 operate, shielding of the external light may be reduced, so as to improve the operating performance of the optical device 500.

In some examples, referring to FIG. 4 again, the peripheral region B includes at least one bonding region B1. For example, the display region A and the bonding region B1 may have a gap therebetween.

Hereinafter, a structure of the display apparatus 1000 will be schematically described in an example where the optical device 500 is the camera, there is one auxiliary display region A2 and one bonding region B1, and the auxiliary display region A2 is located beside the main display region A1.

In some examples, referring to FIG. 3, the optical device 500 is disposed on a non-light exit side of the display substrate 100, and is located in the auxiliary display region A2 of the display substrate 100. The external light is able to pass through the display substrate 100 and reach the optical device 500, so that the optical device 500 is able to operate.

In some examples, referring to FIG. 3 again, the touch grid structure 200 may be disposed on a light exit side of the display substrate 100 and located in the display region A of the display substrate 100. That is, the optical device 500 and the touch grid structure 200 are respectively located on two opposite sides of the display substrate 100.

In this design, a user may control an image to be displayed on the display substrate 100 by using the touch grid structure 200, so that the display apparatus 1000 has both a display function and a touch function.

In some examples, referring to FIG. 2, the touch driver chip 300 may be disposed in the bonding region B1, and may be located on the same side of the display substrate 100 as the touch grid structure 200. The touch driver chip 300 may transmit touch driving signals to the touch grid structure 200, and may also receive touch sensing signals transmitted by the touch grid structure 200, so that the user is able to control the image to be displayed on the display substrate 100 through the touch grid structure 200.

In some examples, referring to FIG. 2 again, the plurality of signal transmission lines 400, the touch grid structure 200, and the touch driver chip 300 are located on the same side of the display substrate 100. An end of each signal transmission line 400 extends into the display region A, and is electrically connected to the touch grid structure 200, and another end of each signal transmission line 400 extends into the bonding region B1, and is electrically connected to the touch driver chip 300. In this way, the touch driving signals and the touch sensing signals may be transmitted between the touch driver chip 300 and the touch grid structure 200 through the signal transmission lines 400.

In this case, since the touch grid structure 200 is located in the display region A, and the touch driver chip 300 is located in the bonding region B1, which means that the signal transmission lines 400 need to pass through the peripheral region B to realize electrical connections between the touch grid structure 200 and the touch driver chip 300.

In some examples, in a non-operating process of the optical device 500, the portion of the display substrate 100 located in the display region A is able to display image(s).

In some examples, in an operating process of the optical device 500 (e.g., in a process of the user taking a selfie), the portion of the display substrate 100 located in the main display region A1 may display a selfie image of the user, and the portion of the display substrate 100 located in the auxiliary display region A2 may display a black image, which clearly shows a location of the optical device 500.

In some other examples, in the operating process of the optical device 500 (e.g., in the process of the user taking a selfie), the portion of the display substrate 100 located in the main display region A1 and the portion of the display substrate 100 located in the auxiliary display region A2 may display an overall selfie image of the user.

Hereinafter, a structure of the display substrate 100 provided in some embodiments of the present disclosure will be schematically described with reference to the accompanying drawings.

In some embodiments, referring to FIG. 4, the display substrate 100 includes a substrate 1.

It will be noted that a type of the substrate 1 varies, and may be set according to actual needs.

For example, the substrate 1 may be a rigid substrate. The rigid substrate may be, for example, a glass substrate or a polymethyl methacrylate (PMMA) substrate.

For example, the substrate 1 may be a flexible substrate. The flexible substrate may be, for example, a polyethylene terephthalate (PET) substrate, a polyimide (PI) substrate, or a polyethylene naphthalate two formic acid glycol ester (PEN) substrate.

In some embodiments, referring to FIG. 4 again, the display substrate 100 further includes a plurality of first sub-pixels P1 and a plurality of second sub-pixels P2 that are all disposed on a side of the substrate 1. The plurality of first sub-pixels P1 and the plurality of second sub-pixels P2 may cooperate with each other, so that the display substrate 100 is able to display image(s).

In some examples, each first sub-pixel P1 includes a pixel driving circuit and a light-emitting device. The light-emitting device may be located on a side of the pixel driving circuit away from the substrate 1, and is electrically connected to the pixel driving circuit. The pixel driving circuit is configured to supply a driving voltage to the light-emitting device, so as to control a light-emitting state of the light-emitting device.

Figure 5:
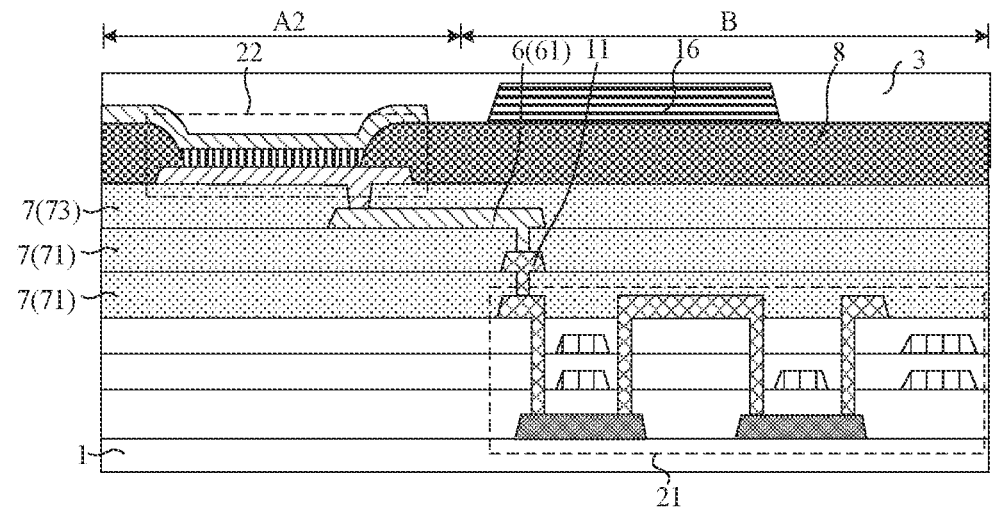
FIG. 5 is a partial structural diagram of a display substrate, in accordance with some embodiments of the present disclosure.

Referring to FIGS. 4 and 5, each second sub-pixel P2 includes a pixel driving circuit 21 and a light-emitting device 22. The light-emitting device 22 may be located on a side of the pixel driving circuit 21 away from the substrate 1, and is electrically connected to the pixel driving circuit 21. The pixel driving circuit 21 is configured to supply a driving voltage to the light-emitting device 22, so as to control a light-emitting state of the light-emitting device 22.

It will be noted that a structure of the pixel driving circuit included in the first sub-pixel P1 may be the same as a structure of the pixel driving circuit 21 included in the second sub-pixel P2. For example, a structure of the light-emitting device included in the first sub-pixel P1 may be the same as a structure of the light-emitting device 22 included in the second sub-pixel P2.

For example, the structure of the pixel driving circuit 21 may vary, which is not limited. For example, the pixel driving circuit 21 may have a structure such as "6T1C," "7T1C," "6T2C" or "7T2C". Here, "T" represents a thin film transistor, and a number before "T" represents the number of thin film transistors, "C" represents a storage capacitor, and a number before "C" represents the number of storage capacitors. For another example, thin film transistors included in the pixel driving circuit 21 may be bottom-gate thin film transistors or top-gate thin film transistors.

For example, the structure of the light-emitting device 22 may vary, which is not limited. For example, the light-emitting device 22 may be an organic light-emitting diode (OLED) device, or a quantum dot light-emitting diode (QLED) device. For another example, a light-emitting type of the light-emitting device 22 may be a top light-emitting type or a bottom light-emitting type.

A description will be made in some embodiments of the present disclosure in an example where the thin film transistors in the pixel driving circuit 21 are the top-gate thin film transistors, the light-emitting device 22 is the OLED device, and the light-emitting type of the light-emitting device 22 is the top light-emitting type.

In some examples, the pixel driving circuit in the first sub-pixel P1 may be electrically connected to a corresponding light-emitting device through a connection structure, and referring to FIG. 5, the pixel driving circuit 21 in the second sub-pixel P2 may be electrically connected to a corresponding light-emitting device 22 through a connection structure 11, which is beneficial to reducing a difficulty of wiring.

In some examples, referring to FIG. 4, the plurality of first sub-pixels P1 included in the display substrate 100 are located in the main display region A1. In the plurality of second sub-pixels P2 included in the display substrate 100, the light-emitting devices 22 are located in the auxiliary display region A2, and at least one pixel driving circuit 21 is located outside the auxiliary display region A2.

For example, only one pixel driving circuit 21 in the plurality of second sub-pixels P2 is located outside the auxiliary display region A2. Alternatively, the pixel driving circuit 21 in each second sub-pixel P2 is located outside the auxiliary display region A2.

It will be noted that the phrase "located outside the auxiliary display region A2" may be, for example, the phrase "located in the peripheral region B and/or the main display region A1".

For example, in a case where only one pixel driving circuit 21 in the plurality of second sub-pixels P2 is located outside the auxiliary display region A2, this pixel driving circuit 21 located outside the auxiliary display region A2 may be located in the peripheral region B or the main display region A1.

For example, in a case where the pixel driving circuit 21 in each second sub-pixel P2 is located outside the auxiliary display region A2, i.e., in a case where a plurality of pixel driving circuits 21 are located outside the auxiliary display region A2, the plurality of pixel driving circuits 21 located outside the auxiliary display region A2 may be located in the peripheral region B, or may be located in the main display region A1. Alternatively, part of the plurality of pixel driving circuits may be located in the peripheral region B, and another part of the plurality of pixel driving circuits may be located in the main display region A1.

For example, if the pixel driving circuits 21 in the plurality of second sub-pixels P2 are disposed in the peripheral region B and/or the main display region A1, the plurality of pixel driving circuits 21 may be arranged close to the auxiliary display region A2, and the plurality of pixel driving circuits 21 are arranged in sequence or in an array.

The pixel driving circuit 21 is mainly composed of metal lines, and the metal lines are able to form a strong blocking effect on light. In some of the above examples, the at least one pixel driving circuit 21 is disposed outside the auxiliary display region A2, so that the number of pixel driving circuits 21 disposed in the auxiliary display region A2 may be reduced. Thus, in the process of the external light passing through the portion of the display substrate 100 located in the auxiliary display region A2 and reaching the optical device 500 to make the optical device 500 operate, the shielding of the external light may be reduced to increase a light transmittance of the display substrate 100, so as to improve the operating performance of the optical device 500.

Figure 6:
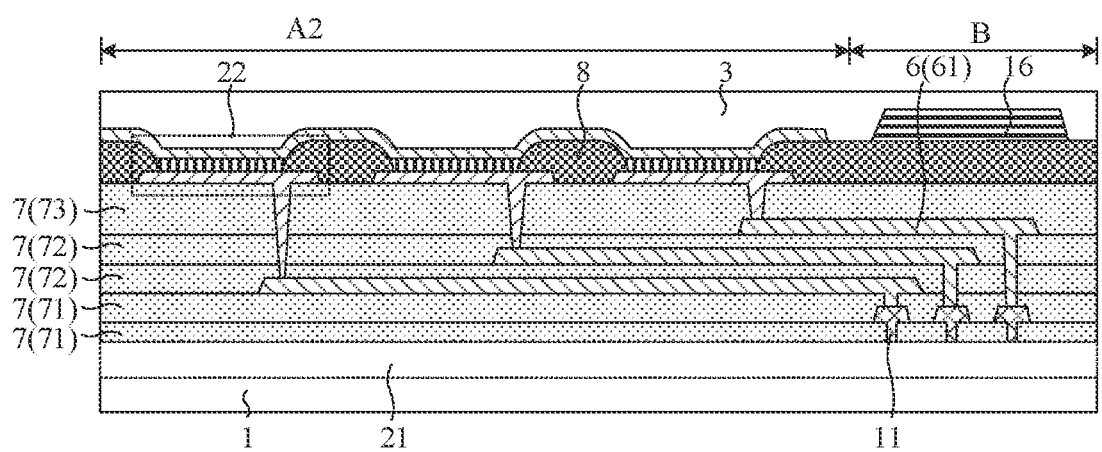
FIG. 6 is a partial structural diagram of another display substrate, in accordance with some embodiments of the present disclosure.

In some embodiments, referring to FIGS. 4 to 6, the display substrate further includes an encapsulation layer 3 disposed on a side of the plurality of first sub-pixels P1 and the plurality of second sub-pixels P2 away from the substrate 1. The encapsulation layer 3 is configured to encapsulate the plurality of first sub-pixels P1 and the plurality of second sub-pixels P2 on the substrate 1.

In some examples, orthographic projections of the plurality of first sub-pixels P1 and the plurality of second sub-pixels P2 on the substrate 1 are located within an orthographic projection of the encapsulation layer 3 on the substrate 1. In this design, a good encapsulation effect on the light-emitting devices included in the first sub-pixels P1 and the light-emitting devices 22 included in the second sub-pixels P2 may be formed by using the encapsulation layer 3, so as to avoid affecting luminous efficiencies and service lives of the light-emitting devices included in the first sub-pixels P1 and the light-emitting devices 22 included in the second sub-pixels P2 due to the erosion of external water vapor and/or oxygen.

In some examples, referring to FIGS. 4 and 7 to 14, the encapsulation layer 3 may include a first inorganic layer 31, an organic layer 32 disposed on a side of the first inorganic layer 31 away from the substrate 1, and a second inorganic layer 33 disposed on a side of the organic layer 32 away from the substrate 1. For example, the first inorganic layer 31 and/or the second inorganic layer 33 may be formed by using an inorganic insulating material and using a deposition process. For example, the organic layer 32 may be formed by using an organic insulating material and using an inkjet printing process.

Based on this, in some embodiments, referring to FIGS. 4 and 7 to 14 again, the display substrate 100 further includes a first dam 4 and a second dam 5. The second dam 5 is used to confine part of the encapsulation layer 3 to a region surrounded thereby.

In some examples, the second dam 5 is farther from the display region A than the first dam 4, and the first dam 4 is farther from the display region A than at least one pixel driving circuit 21 disposed in the peripheral region B. That is, in the display substrate 100, the pixel driving circuit(s) 21, the first dam 4, and the second dam 5 that are all disposed in the peripheral region B are away from the display region A in sequence.

For example, referring to FIG. 4, the first dam 4 and the second dam 5 may be disposed at an edge of the display substrate 100, and may each be arranged in a ring shape. The first dam 4 surrounds the plurality of first sub-pixels P1 and the plurality of second sub-pixels P2, and the second dam 5 surrounds the first dam 4.

For example, the first inorganic layer 31 may cover the plurality of first sub-pixels P1 and the plurality of second sub-pixels P2, and cover the first dam 4 and the second dam 5, so as to form a good encapsulation effect.

For example, the organic layer 32 may be located within a range defined by the first dam 4. That is, an orthographic projection of the organic layer 32 on the substrate 1 is located within a range defined by an orthographic projection of the first dam 4 on the substrate 1. This means that the first dam 4 is able to confine the organic layer 32 in the encapsulation layer 3 to a region surrounded thereby to ensure a good encapsulation effect.

For example, a height of the second dam 5 is greater than a height of the first dam 4. The height of the second dam 5 may be a vertical distance between an end of the second dam 5 away from the substrate 1 and the substrate 1. The height of the first dam 4 may be a vertical distance between an end of the first dam 4 away from the substrate 1 and the substrate 1.

It will be noted that due to a process of forming the organic layer 32, certain errors exist inevitably, so that the first dam 4 may not form a good blocking effect on the organic layer 32. In the above examples, the height of the second dam 5 is set to be greater than the height of the first dam 4, so that the second dam 5 is used for further blocking the organic layer 32, so as to improve a blocking effect on the organic layer 32, thereby improving the encapsulation effect of the encapsulation layer 3.

For example, the second inorganic layer 33 may cover the organic layer 32 and the first inorganic layer 31, and cover the first dam 4 and the second dam 5 while covering the first inorganic layer 31, so as to form a good encapsulation effect.

It will be noted that since the orthographic projection of the organic layer 32 on the substrate 1 is located within the range defined by the orthographic projection of the first dam 4 on the substrate 1, and the first inorganic layer 31 and the second inorganic layer 33 cover the first dam 4 and the second dam 5, a portion of the first inorganic layer 31 beyond the organic layer 32 may be in contact with a portion of the second inorganic layer 33 beyond the organic layer 32.

In some examples, referring to FIGS. 7 to 14, the display substrate 100 further includes a connection portion 15 located between the first dam 4 and the second dam 5, and the connection portion 15 connects the first dam 4 and the second dam 5. At least a portion of the first dam 4, at least a portion of the connection portion 15 and at least a portion of the second dam 5 are of an integrative structure.

It will be noted that the at least a portion of the first dam 4, the at least a portion of the connection portion 15 and the at least a portion of the second dam 5 are of the integrative structure, which may be that, for example, a portion of the first dam 4, a portion of the connection portion 15 and a portion of the second dam 5 are of an integrative structure.

For example, a height of the connection portion 15 is less than the height of the first dam 4. The height of the connection portion 15 may be a vertical distance between an end of the connection portion 15 away from the substrate 1 and the substrate 1, and the height of the first dam 4 may be the vertical distance between the end of the first dam 4 away from the substrate 1 and the substrate 1.

In some of the above examples, the first dam 4 and the second dam 5 have a gap therebetween. The first dam 4 and the second dam 5 are connected through the connection portion 15, so that a level difference between the first dam 4 and the gap may be reduced, and a level difference between the second dam 5 and the gap may be reduced.

On this basis, for example, the signal transmission lines 400 in the display apparatus 1000 may be formed by using a photolithography process. That is, in a process of forming the signal transmission lines 400 on the light exit side (i.e., a side of the encapsulation layer 3 away from the substrate 1) of the display substrate 100, a conductive material film may be formed by using a deposition process, and then a photoresist is coated on a side of the conductive material film away from the substrate 1. Then, the photoresist is exposed and developed, and the conductive material film is patterned, so as to obtain the signal transmission lines 400. In this case, since the signal transmission lines 400 need to pass through the peripheral region B to realize the connections between the touch grid structure 200 and the touch driver chip 300, orthographic projections of the signal transmission lines 400 on the substrate 1 are each partially overlapped with an orthographic projection of the connection portion 15 on the substrate 1. That is, a portion of the signal transmission line 400 covers the gap between the first dam 4 and the second dam 5 (as shown in FIGS. 7 to 12).

In some of the above examples, the level difference between the first dam 4 and the gap is reduced, and the level difference between the second dam 5 and the gap is reduced, so that in a process of forming the signal transmission lines 400 by using the photolithography process, the thickness of the photoresist in the gap may be reduced. In this way, in a process of exposing and developing the photoresist, photoresist residues in the gap may be avoided. Thus, in a process of patterning the conductive material film, conductive material residues may be avoided, and a short circuit of the signal transmission line 400 is finally avoided, so as to improve a yield of the display apparatus 1000.

In some embodiments, referring to FIGS. 7 to 13, the first dam 4 includes a plurality of first blocking layers 41 that are stacked in sequence, and the second dam 5 includes a plurality of second blocking layers 51 that are stacked in sequence.

It will be noted that an arrangement manner of the plurality of the first blocking layers 41 included in the first dam 4 and the plurality of the second blocking layers 51 included in the second dam 5 varies, and may be set according to actual needs.

In some examples, a total number of the second blocking layers 51 is greater than a total number of the first blocking layers 41.

In some of the above examples, the plurality of first blocking layers 41 are provided to constitute the first dam 4, and the plurality of second blocking layers 51 are provided to constitute the second dam 5, so that the heights of the first dam 4 and the second dam 5 may be effectively increased, which is beneficial to ensuring the blocking effect and a leveling effect on the organic layer 32 in the encapsulation layer 3, so as to ensure a good encapsulation effect of the encapsulation layer 3.

In some examples, referring to FIGS. 7 to 13 again, the connection portion 15 includes at least one connection layer 10, and a total number of the connection layer(s) 10 is less than the total number of the first blocking layers 41.

For example, at least one of the plurality of first blocking layers 41 proximate to the substrate and at least one of the plurality of second blocking layers 51 proximate to the substrate are connected through at least one connection layer 10. For example, a connection layer 10 connects a first blocking layer 41 and a second blocking layer 51.

For example, the connection layer(s) 10 are arranged in a same layer as both the first blocking layer(s) 41 and the second blocking layer(s) 51 connected to the connection layer(s) 10. For example, the first dam 4, the second dam 5 and the connection layer(s) 10 may be of an integrative structure.

In some examples, referring to FIGS. 7 to 14, a side wall 411 of the first dam 4 proximate to the display region A is gradually away from the display region A in a direction Z perpendicular to the substrate 1 and from the substrate 1 to the connection portion 15.

For example, the side wall of the first dam 4 proximate to the display region A may be in a slope shape as shown in FIGS. 7 to 14, or may be in a step shape.

In some examples, referring to FIGS. 7 to 14 again, a portion 4121, unconnected to the connection portion 15, of a side wall 412 of the first dam 4 away from the display region A gradually approaches the display region A in the direction Z perpendicular to the substrate 1 and from the substrate 1 to the connection portion 15.

Figure 7:
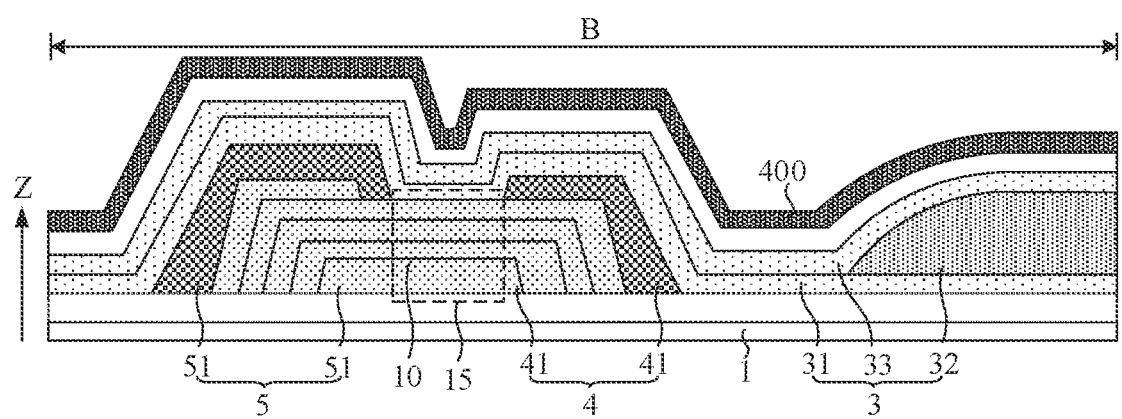
FIG. 7 is a partial structural diagram of yet another display substrate, in accordance with some embodiments of the present disclosure.
Figure 8:
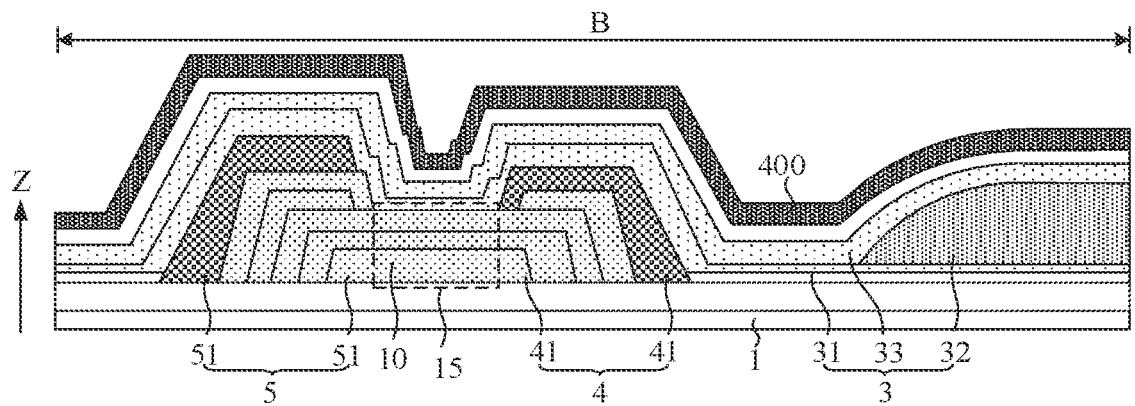
FIG. 8 is a partial structural diagram of yet another display substrate, in accordance with some embodiments of the present disclosure.
Figure 9:
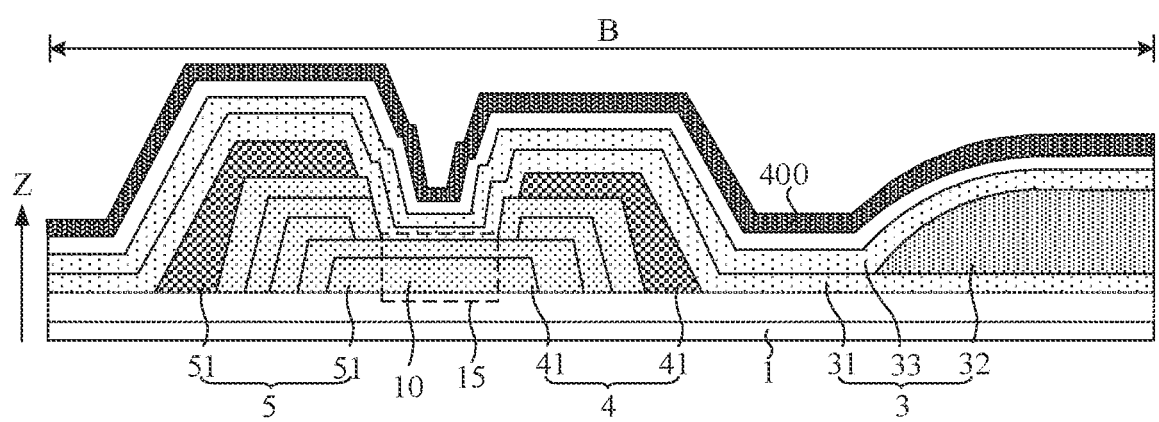
FIG. 9 is a partial structural diagram of yet another display substrate, in accordance with some embodiments of the present disclosure.
Figure 10:
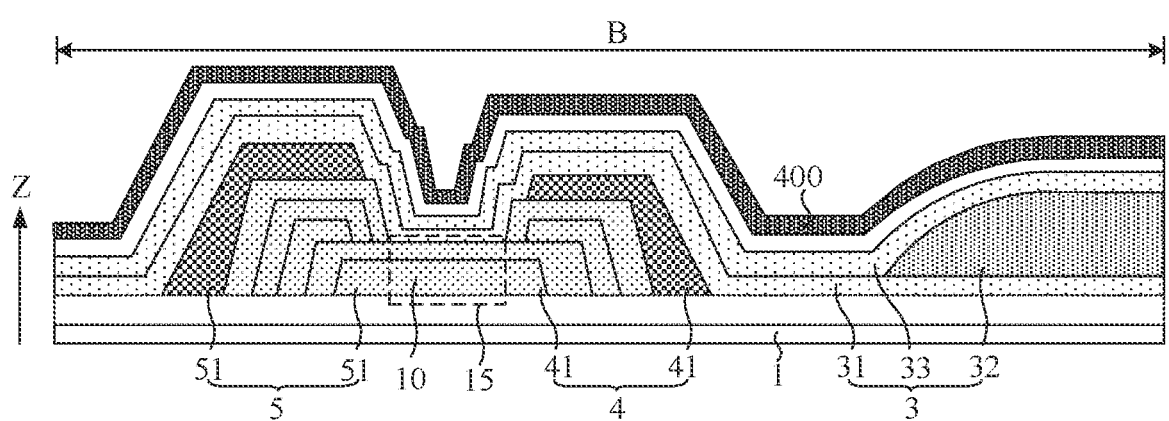
FIG. 10 is a partial structural diagram of yet another display substrate, in accordance with some embodiments of the present disclosure.

For example, the portion, unconnected to the connection portion 15, of the side wall of the first dam 4 away from the display region A may be in a slope shape as shown in FIGS. 7, 8 and 11 to 14, or may be in a step shape as shown in FIGS. 9 and 10.

In some examples, referring to FIGS. 7 to 14 again, a portion 5121, unconnected to the connection portion 15, of a side wall 512 of the second dam 5 proximate to the display region A is gradually away from the display region A in the direction Z perpendicular to the substrate 1 and from the substrate 1 to the connection portion 15.

For example, the portion, unconnected to the connection portion 15, of the side wall of the second dam 5 proximate to the display region A may be in a step shape as shown in FIGS. 8 to 10, or may be in a slope shape as shown in FIGS. 7, and 11 to 14.

In some examples, referring to FIGS. 7 to 14 again, a side wall 511 of the second dam 5 away from the display region A gradually approaches the display region A in the direction away from the substrate 1.

For example, the side wall of the second dam 5 away from the display region A may be in a slope shape as shown in FIGS. 7 to 14, or may be in a step shape.

Figure 14:
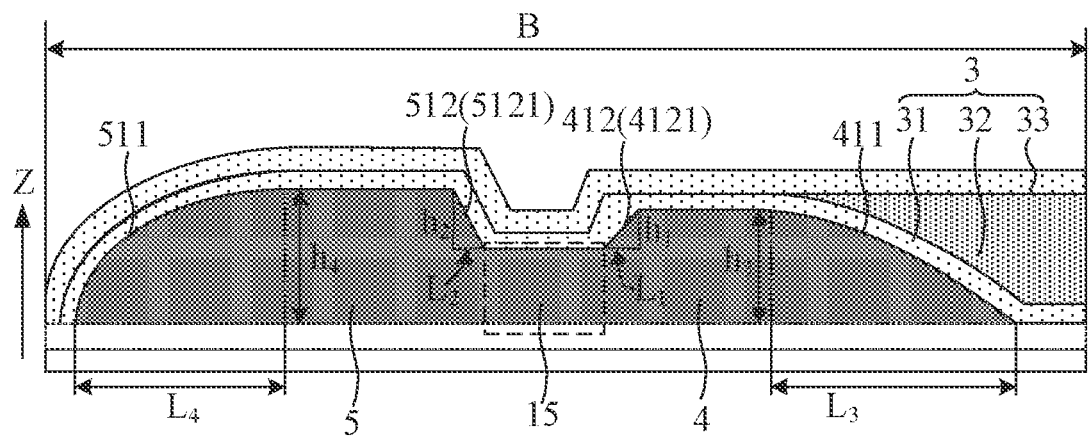
FIG. 14 is a partial structural diagram of yet another display substrate, in accordance with some embodiments of the present disclosure.

In some examples, referring to FIG. 14, a slope of the portion, unconnected to the connection portion 15, of the side wall of the first dam 4 away from the display region A (i.e., a ratio of a height $h_1$ of this portion to a horizontal distance $L_1$ of this portion) is less than a slope of the portion, unconnected to the connection portion 15, of the side wall of the second dam 5 proximate to the display region A (i.e., a ratio of a height $h_2$ of this portion to a horizontal distance $L_2$ of this portion).

In some of the above examples, the slope of the portion, unconnected to the connection portion 15, of the side wall of the second dam 5 proximate to the display region A is increased, so that the blocking effect and the leveling effect of the second dam 5 on the organic layer 32 in the encapsulation layer 3 is able to be further ensured, and thus the good encapsulation effect of the encapsulation layer 3 is further ensured.

In some examples, referring to FIG. 14, a slope of the side wall of the first dam 4 proximate to the display region A (i.e., a ratio of a height $h_3$ of this side wall to a horizontal distance $L_3$ of this side wall) is less than a slope of the side wall of the second dam 5 away from the display region A (i.e., a ratio of a height $h_4$ of this side wall to a horizontal distance $L_4$ of this side wall).

In some of the above examples, the slope of the side wall of the second dam 5 away from the display region A is increased, so that a size of the display substrate 100 is able to be reduced, thereby saving materials and reducing the manufacturing cost.

It is easy to understand that the calculation method of the slope is not only suitable for a case that at least one of the four (i.e., the portion, unconnected to the connection portion 15, of the side wall of the first dam 4 away from the display region A, the portion, unconnected to the connection portion 15, of the side wall of the second dam 5 proximate to the display region A, the side wall of the first dam 4 proximate to the display region A, and the side wall of the second dam 5 away from the display region A) is in a slope shape, but also suitable for a case that at least one of the four (i.e., the portion, unconnected to the connection portion 15, of the side wall of the first dam 4 away from the display region A, the portion, unconnected to the connection portion 15, of the side wall of the second dam 5 proximate to the display region A, the side wall of the first dam 4 proximate to the display region A, and the side wall of the second dam 5 away from the display region A) is in a step shape.

It will be noted that after the heights of the first dam 4 and the second dam 5 are increased, a depth of the gap formed between the first dam 4 and the second dam 5 in the direction Z perpendicular to the substrate 1 and from the substrate 1 to the connection portion 15 is also increased. At least one corresponding first blocking layer 41 and at least one corresponding second blocking layer 51 are connected through at least one connection layer 10, so that the level difference between the first dam 4 and the gap, and the level difference between the second dam 5 and the gap may also be reduced.

Thus, in the display substrate 100 provided in some embodiments of the present disclosure, after the at least one pixel driving circuit 21 in the plurality of second sub-pixels P2 is disposed in the peripheral region B, the first dam 4 composed of the plurality of first blocking layers 41 and the second dam 5 composed of the plurality of second blocking layers 51 may be disposed in the peripheral region B to realize the blocking effect on the part of the encapsulation layer 3, so as to ensure the encapsulation effect of the encapsulation layer 3.

It will be noted that the optical device 500 is disposed under the display substrate 100, the light-emitting device 22 and the pixel driving circuit 21 above the optical device 500 are separated from each other, and an electrical connection between the light-emitting device 22 and the pixel driving circuit 21 is realized through the at least one conductive line layer. Moreover, although the thickness of the portion of the display substrate 100 located in the auxiliary display region A2 is increased due to the insulating layers disposed between the light-emitting device and the conductive line layers, between two adjacent conductive line layers, and between the conductive line layers and the pixel driving circuit, the first dam 4 composed of the plurality of first blocking layers 41 and the second dam 5 composed of the plurality of second blocking layers 51 in some embodiments of the present disclosure are able to realize the blocking effect on the part of the encapsulation layer 3, so as to ensure the encapsulation effect of the encapsulation layer 3.

Moreover, the at least one corresponding first blocking layer 41 and the at least one corresponding second blocking layer 51 are connected through the at least one connection layer 10, and in this case, an orthogonal projection of the gap between the first dam 4 and the second dam 5 on the substrate 1 is overlapped with orthographic projection(s) of the at least one connection layer 10 on the substrate 1, so that the level difference between the first dam 4 and the gap, and the level difference between the second dam 5 and the gap may be effectively reduced. In this way, in a case where the display substrate 100 is applied to the display apparatus 1000, the conductive material residues of the signal transmission lines 400 may be effectively avoided, and thus the short circuit of the signal transmission line 400 is avoided, so as to improve the yield of the display apparatus 1000.

In some embodiments, referring to FIGS. 5 and 6, the display substrate 100 further includes a plurality of planarization layers 7. The plurality of planarization layers 7 are disposed between the pixel driving circuit(s) 21 located in the peripheral region B and the light-emitting devices 22, and are stacked in sequence.

The first blocking layer(s) 41 in the plurality of first blocking layers 41 other than one or two first blocking layers 41 farthest from the substrate 1 each are arranged in a same layer as a respective planarization layer 7 in part of the plurality of planarization layers 7; and/or the second blocking layers 51 in the plurality of second blocking layers 51 other than one or two second blocking layers 51 farthest from the substrate 1 each are arranged in another same layer as a respective planarization layer 7 in all of the plurality of planarization layers 7.

It will be noted that the part of the plurality of planarization layers 7 may be some of the plurality of planarization layers 7.

In some examples, referring to FIGS. 5 and 6 again, the display substrate 100 further includes a pixel defining layer 8 disposed on a side of the plurality of planarization layers 7 away from the substrate 1, and a plurality of support pads 16 disposed on a side surface of the pixel defining layer 8 away from the substrate 1.

The first blocking layer 41 in the plurality of first blocking layers 41 farthest from the substrate 1 is arranged in a same layer as the pixel defining layer 8 or the plurality of support pads 16; and/or the second blocking layer 51 in the plurality of second blocking layers 51 farthest from the substrate 1 is arranged in a same layer as the pixel defining layer 8 or the plurality of support pads 16.

For example, the pixel defining layer 8 has a plurality of openings, and each opening is provided with at least one portion of a light-emitting device 22 therein. The pixel defining layer 8 is arranged in this way, so that light-emitting regions of each first sub-pixel P1 and each second sub-pixel P2 may be defined.

For example, in a case where the first blocking layer 41 in the plurality of first blocking layers 41 farthest from the substrate 1 is arranged in the same layer as the plurality of support pads 16, a first blocking layer 41 in the plurality of first blocking layers 41 second farthest from the substrate 1 is arranged in a same layer as the pixel defining layer 8.

In a case where the second blocking layer 51 in the plurality of second blocking layers 51 farthest from the substrate 1 is arranged in the same layer as the plurality of support pads 16, a second blocking layer 51 in the plurality of second blocking layers 51 second farthest from the substrate 1 is arranged in a same layer as the pixel defining layer 8.

In some examples, referring to FIGS. 5 and 6 again, the display substrate 100 further includes at least one conductive line layer 6, and each conductive line layer 6 includes at least one light-transmitting conductive line 61. A pixel driving circuit 21 located in the peripheral region B is electrically connected to a corresponding light-emitting device 22 through a light-transmitting conductive line 61. That is, an end of the light-transmitting conductive line 61 may extend into the peripheral region B, and may be electrically connected to the pixel driving circuit 21 (e.g., may be electrically connected to the pixel driving circuit 21 through the connection structure 11), and another end of the light-transmitting conductive line 61 may extend into the auxiliary display region A2, and may be electrically connected to the corresponding light-emitting device 22. The pixel driving circuit 21 located in the peripheral region B supplies a driving voltage to a corresponding light-emitting device 22 through a light-transmitting conductive line 61, so as to control the light-emitting state of the corresponding light-emitting device 22.

For example, the number of the light-transmitting conductive line(s) 61 may be equal to the number of the pixel driving circuit(s) 21 located in the peripheral region B.

For example, the number of the conductive line layer(s) 6 may be two or three. For example, the number of the conductive line layers 6 is three. In this design, a sufficient space is able to be provided for a wiring arrangement of the light-transmitting conductive lines 61, thereby preventing interference between the light-transmitting conductive lines 61.

It will be noted that since the pixel driving circuit 21 is electrically connected to the corresponding light-emitting device 22 through the light-transmitting conductive line 61, insulating layer(s) are required to be provided between the pixel driving circuit 21 and the conductive line layer(s) 6 as a whole, and insulating layer(s) are required to be provided between the conductive line layer(s) 6 as a whole and the light-emitting device 22.

For example, at least one planarization layer 7 (i.e., the insulating layer(s)) is disposed between the entire at least one conductive line layer 6 and the pixel driving circuit 21. At least one planarization layer 7 (i.e., the insulating layer(s)) is disposed between the entire at least one conductive line layer 6 and the light-emitting device 22. In this design, a flatness and a continuity of the conductive line layer 6 may be ensured.

It will be noted that in a case where the display substrate 100 includes a plurality of conductive line layers 6, insulating layer(s) are required to be provided between two adjacent conductive line layers 6.

For example, at least one planarization layer 7 (i.e., the insulating layer(s)) is disposed between two adjacent conductive line layers 6.

It will be noted that the number of the planarization layers 7 is related to a total number of the conductive line layer(s) 6.

In some examples, referring to FIG. 5, there is a single conductive line layer 6. That is, the light-transmitting conductive line(s) 61 are arranged in a same layer. On this basis, for example, each light-transmitting conductive line 61 may be connected to a pixel driving circuit 21 located in the peripheral region B through a connection structure 11, and each light-transmitting conductive line 61 is also electrically connected to a corresponding light-emitting device 22 located in the auxiliary display region A2. In this case, for example, only one planarization layer 7 may be disposed between the conductive line layer 6 and the connection structure 11. For example, only one planarization layer 7 may be disposed between the connection structure 11 and the pixel driving circuit 21. For example, only one planarization layer 7 may be disposed between the conductive line layer 6 and the light-emitting device 22. Therefore, the display substrate 100 may include three planarization layers 7 that are stacked in sequence.

In some other examples, referring to FIG. 6, there are a plurality of conductive line layers 6. That is, a plurality of light-transmitting conductive lines 61 are located in a plurality of layers. Each conductive line layer 6 includes at least one light-transmitting conductive line 61. At least one planarization layer 7 is disposed between two adjacent conductive line layers 6.

For example, the total number of conductive line layers 6 is three. On this basis, for example, each light-transmitting conductive line 61 may be connected to a corresponding pixel driving circuit 21 located in the peripheral region B through a connection structure 11 and each light-transmitting conductive line 61 is also electrically connected to a corresponding light-emitting device 22 located in the auxiliary display region A2. In this case, in the three conductive line layers 6, for example, only one planarization layer 7 may be disposed between every two adjacent conductive line layers 6. For example, only one planarization layer 7 may be disposed between a conductive line layer 6 closest to the pixel driving circuit 21 and the connection structure 11. For example, only one planarization layer 7 may be disposed between the connection structure 11 and the pixel driving circuit 21. For example, only one planarization layer 7 may be disposed between a conductive line layer 6 closest to the light-emitting device 22 and the light-emitting device 22. Therefore, the display substrate 100 may include five planarization layers 7 that are stacked in sequence.

For example, in a case where the total number of conductive line layers 6 is three, one conductive line layer 6 may be electrically connected to light-emitting devices 22 capable of emitting red light, another conductive line layer 6 may be electrically connected to light-emitting devices 22 capable of emitting green light, and yet another conductive line layer 6 may be electrically connected to light emitting devices 22 capable of emitting blue light.

It is easy to understand that the "same layer" in the embodiments of the present disclosure means that a film layer for forming a specific pattern is formed by a same film forming process, and then is patterned by one patterning process using a same mask to form a layer structure. Depending on different specific patterns, the one patterning process may include several exposure, development or etching processes, and the specific patterns in the formed layer structure may be continuous or discontinuous, and these specific patterns may also be at different heights or have different thicknesses. In this way, the plurality of light-transmitting conductive lines 61 may be synchronously formed in the one patterning process, which is beneficial to simplifying the manufacturing process of the display substrate 100.

For example, the light-transmitting conductive lines 61 may be formed of a conductive material with a high light transmittance. The conductive material may include, for example, indium tin oxide (ITO), indium zinc oxide (IZO), or indium gallium zinc oxide (IGZO).

In some of the above examples, the light-transmitting conductive line 61 is used to connect the pixel driving circuit 21 and the light-emitting device 22 that are corresponding to each other, which is beneficial to further improving the light transmittance of the portion of the display substrate 100 located in the auxiliary display region A2, so as to improve the operating performance of the optical device 500.

In some examples, the planarization layer(s) 7 located between the entire at least one conductive line layer 6 and the pixel driving circuit 21 are first planarization layer(s) 71. A second blocking layer 51 in the plurality of second blocking layers 51, which is arranged in a same layer as the first planarization layer 71 is connected to a corresponding first blocking layer 41 through a connection layer 10.

For example, the entire at least one conductive line layer 6 is directly electrically connected to the pixel driving circuit 21. For example, only one planarization layer 7 is disposed between the entire at least one conductive line layer 6 and the pixel driving circuit 21, and there is a single first planarization layer 71.

For example, referring to FIGS. 5 and 6, the at least one conductive line layer 6 is respectively electrically connected to the pixel driving circuit(s) 21 through respective connection structure(s) 11. For example, only one planarization layer is disposed between the entire at least one conductive line layer 6 and the connection structure 11. For example, only one planarization layer 7 is disposed between the connection structure 11 and the pixel driving circuit 21. The number of the first planarization layers 71 is two.

In some examples, referring to FIG. 6, the planarization layer 7 located between two adjacent conductive line layers 6 is a second planarization layer 72. At least one second blocking layer 51 in the plurality of second blocking layers 51, each of which is arranged in a same layer as a respective one of at least one second planarization layer 72, is respectively connected to at least one first blocking layer 41 through respective connection layer(s) 10.

In some examples, referring to FIG. 6 again, the planarization layer(s) 7 located between the entire at least one conductive line layer 6 and the light-emitting device 22 are third planarization layer(s) 73. The plurality of second blocking layers 51 further include at least one second blocking layer 51 each arranged in a same layer as a respective one of at least one third planarization layer 73. For example, there is a single third planarization layer 73.

For example, referring to FIG. 6 again, the total number of the conductive line layers 6 is three, and the conductive line layers 6 are respectively electrically connected to the pixel driving circuits 21 through respective connection structures 11. One planarization layer 7 is disposed between the conductive line layers 6 as a whole and the connection structure 11. One planarization layer 7 is disposed between the connection structure 11 and the pixel driving circuit 21. One planarization layer 7 is disposed between every two adjacent conductive line layers 6. One planarization layer 7 is disposed between the conductive line layers 6 as the whole and the light-emitting device 22. That is, the number of the first planarization layers 71 is two, the number of the second planarization layers 72 is two, and there is a single third planarization layer 73. In addition, there is a single pixel defining layer 8, and the plurality of support pads 16 are of a single layer. Therefore, the first dam 4 includes five first blocking layers 41 that are stacked in sequence. For example, in the direction Z perpendicular to the substrate 1 and from the substrate 1 to the connection portion 15, the two first planarization layers 71, the two second planarization layers 72, and the pixel defining layer 8 (or the layer where the support pads 16 are located) each may be arranged in a same layer as a respective one of the five first blocking layers 41. The second dam 5 includes six second blocking layers 51 that are stacked in sequence. For example, in the direction Z perpendicular to the substrate 1 and from the substrate 1 to the connection portion 15, the two first planarization layers 71, the two second planarization layers 72, the third planarization layer 73, and the pixel defining layer 8 (or the layer where the support pads 16 are located) each may be arranged in a same layer as a respective one of the six second blocking layer 51.

On this basis, the display substrate 100 may include, for example, four connection layers 10 shown in FIG. 7. For example, in the direction Z perpendicular to the substrate 1 and from the substrate 1 to the connection portion 15, the two first planarization layers 71 and the two second planarization layers 72 each may be arranged in a same layer as a respective one of the four connection layers 10. In this case, in the direction Z perpendicular to the substrate 1 and from the substrate 1 to the connection portion 15, a first connection layer 10 connects a first first blocking layer 41 and a first second blocking layers 51 to be of an integrative structure; a second connection layer 10 connects a second first blocking layer 41 and a second second blocking layer 51 to be of an integrative structure; a third connection layer 10 connects a third first blocking layer 41 and a third second blocking layer 51 to be of an integrative structure; a fourth connection layer 10 connects a fourth first blocking layer 41 and a fourth second blocking layer 51 to be of an integrative structure; and a fifth second blocking layer 51 and a sixth second blocking layer 51 are unconnected to a fifth first blocking layer 41.

The fifth first blocking layer 41 in the first dam 4, and the fifth second blocking layer 51 and the sixth second blocking layer 51 in the second dam 5 form the gap between the first dam 4 and the second dam 5. An orthographic projection of the first connection layer 10 on the substrate 1, an orthographic projection of the second connection layer 10 on the substrate 1, an orthographic projection of the third connection layer 10 on the substrate 1, an orthographic projection of the fourth connection layer 10 on the substrate 1, and an orthogonal projection of the gap on the substrate 1 are overlapped. In this case, the level difference between the first dam 4 and the gap is the thickness of the fifth first blocking layer 41, and the level difference between the second dam 5 and the gap is a sum of the thicknesses of the fifth second blocking layer 51 and the sixth second blocking layer 51.

Alternatively, the display substrate 100 may include, for example, three connection layers 10 shown in FIG. 8. For example, in the direction Z perpendicular to the substrate 1 and from the substrate 1 to the connection portion 15, the two first planarization layers 71 and a first second planarization layer 72 each may be arranged in a same layer as a respective one of the three connection layers 10. In this case, in the direction Z perpendicular to the substrate 1 and from the substrate 1 to the connection portion 15, a first connection layer 10 connects the first first blocking layer 41 and the first second blocking layer 51 to be of an integrative structure; a second connection layer 10 connects the second first blocking layer 41 and the second second blocking layer 51 to be of an integrative structure; a third connection layer 10 connects the third first blocking layer 41 and the third second blocking layer 51 to be of an integrative structure; and the fourth second blocking layer 51, the fifth second blocking layer 51 and the sixth second blocking layer 51 as a whole are unconnected to the fourth first blocking layer 41 and the fifth first blocking layer 41 as a whole.

The fourth first blocking layer 41 and the fifth first blocking layer 41 in the first dam 4, and the fourth second blocking layer 51, the fifth second blocking layer 51 and the sixth second blocking layer 51 in the second dam 5 form the gap between the first dam 4 and the second dam 5. An orthographic projection of the first connection layer 10 on the substrate 1, an orthographic projection of the second connection layer 10 on the substrate 1, an orthographic projection of the third connection layer 10 on the substrate 1, and an orthogonal projection of the gap on the substrate 1 are overlapped. In this case, the level difference between the first dam 4 and the gap is a sum of the thicknesses of the fourth first blocking layer 41 and the fifth first blocking layer 41, and the level difference between the second dam 5 and the gap is a sum of the thicknesses of the fourth second blocking layer 51, the fifth second blocking layer 51, and the sixth second blocking layer 51.

Alternatively, the display substrate 100 may include, for example, two connection layers 10 shown in FIG. 9. For example, in the direction Z perpendicular to the substrate 1 and from the substrate 1 to the connection portion 15, the two connection layers 10 each may be arranged in a same layer as a respective one of the two first planarization layers 71. In this case, in the direction Z perpendicular to the substrate 1 and from the substrate 1 to the connection portion 15, a first connection layer 10 connects the first first blocking layer 41 and the first second blocking layer 51 to be of an integrative structure; a second connection layer 10 connects the second first blocking layer 41 and the second second blocking layer 51 to be of an integrative structure; and the third second blocking layer 51, the fourth second blocking layer 51, the fifth second blocking layer 51 and the sixth second blocking layer 51 as a whole are unconnected to the third first blocking layer 41, the fourth first blocking layer 41 and the fifth first blocking layer 41 as a whole.

The third first blocking layer 41, the fourth first blocking layer 41 and the fifth first blocking layer 41 in the first dam 4, and the third second blocking layer 51, the fourth second blocking layer 51, the fifth second blocking layer 51 and the sixth second blocking layer 51 in the second dam 5 form the gap between the first dam 4 and the second dam 5. An orthographic projection of the first connection layer 10 on the substrate 1, an orthographic projection of the second connection layer 10 on the substrate 1, and an orthogonal projection of the gap on the substrate 1 are overlapped. In this case, the level difference between the first dam 4 and the gap is a sum of the thicknesses of the third first blocking layer 41, the fourth first blocking layer 41 and the fifth first blocking layer 41, and the level difference between the second dam 5 and the gap is a sum of the thicknesses of the third second blocking layer 51, the fourth second blocking layer 51, the fifth second blocking layer 51 and the sixth second blocking layer 51.

It will be noted that in a case where the first dam 4 includes the fifth first blocking layers 41 arranged in a same layer as the pixel defining layer 8, and the second dam 5 includes the sixth second blocking layer 51 arranged in a same layer as the pixel defining layer 8, the first dam 4 may further include, for example, a sixth first blocking layer 41 arranged in a same layer as the support pads 16, and the second dam 5 may further include, for example, a seventh second blocking layer 51 arranged in a same layer as the support pads 16. The sixth first blocking layer 41 is unconnected to the seventh second blocking layer 51.

In some of the above examples, the thickness of the entire at least one connection layer 10 is controlled, i.e., a vertical distance from a top of the first dam 4 to a top of the entire at least one connection layer 10 and a vertical distance from a top of the second dam 5 to the top of the entire at least one connection layer 10 are controlled, so that the conductive material residues of the signal transmission lines 400 are able to be effectively avoided, and the depth of the gap formed between the first dam 4 and the second dam 5 is able to be increased as much as possible, so as to further improve the blocking effect and the leveling effect of the first dam 4 and the second dam 5 on the organic layer 32, thereby further ensuring the good encapsulation effect of the encapsulation layer 3.

In some embodiments, the plurality of first blocking layers 41 are arranged in at least one of following manners.

The first blocking layer 41 in the plurality of first blocking layers 41 farthest from the substrate 1 covers a side surface, facing the second dam 5, of the first blocking layer 41 in the plurality of first blocking layers 41 second farthest from the substrate 1. Alternatively, the first blocking layer 41 in the plurality of first blocking layers 41 second farthest from the substrate 1 covers a side surface, facing the second dam 5, of a first blocking layer 41 in the plurality of first blocking layers 41 third farthest from the substrate 1.

It will be noted that at least one of the manners may be, for example, only one of the manners, or may be, for another example, a combination of two or more manners.

In some examples, referring to FIG. 8, the first blocking layer 41 in the plurality of first blocking layers 41 farthest from the substrate 1 covers the side surface, facing the second dam 5, of the first blocking layer 41 in the plurality of first blocking layers 41 second farthest from the substrate 1.

In some other examples, referring to FIGS. 9 and 10, the first blocking layer 41 in the plurality of first blocking layers 41 second farthest from the substrate 1 covers the side surface, facing the second dam 5, of the first blocking layer 41 in the plurality of first blocking layers 41 third farthest from the substrate 1.

Figure 11:
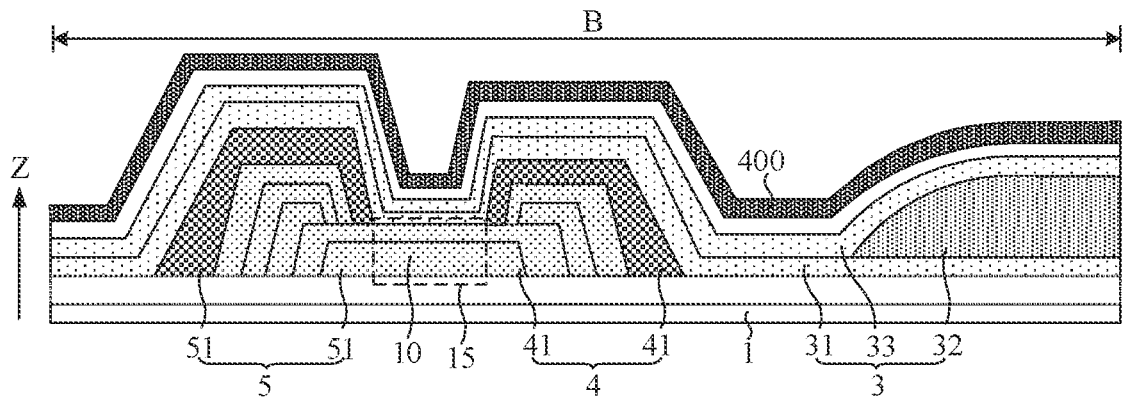
FIG. 11 is a partial structural diagram of yet another display substrate, in accordance with some embodiments of the present disclosure.

In yet other examples, referring to FIG. 11, the first blocking layer 41 in the plurality of first blocking layers 41 farthest from the substrate 1 covers the side surface, facing the second dam 5, of the first blocking layer 41 in the plurality of first blocking layers 41 second farthest from the substrate 1. The first blocking layer 41 in the plurality of first blocking layers 41 second farthest from the substrate 1 covers the side surface, facing the second dam 5, of the first blocking layer 41 in the plurality of first blocking layers 41 third farthest from the substrate 1.

In some embodiments, the plurality of second blocking layers 51 are arranged in at least one of following manners.

The second blocking layer 51 in the plurality of second blocking layers 51 farthest from the substrate 1 covers a side surface, facing the first dam 4, of the second blocking layer 51 in the plurality of second blocking layers 51 second farthest from the substrate 1. Alternatively, the second blocking layer 51 in the plurality of second blocking layers 51 second farthest from the substrate 1 covers a side surface, facing the first dam 4, of a second blocking layer 51 in the plurality of second blocking layers 51 third farthest from the substrate 1. Alternatively, the second blocking layer 51 in the plurality of second blocking layers 51 third farthest from the substrate 1 covers a side surface, facing the first dam 4, of a second blocking layer 51 in the plurality of second blocking layers 51 fourth farthest from the substrate 1.

It will be noted that at least one of the manners may be, for example, only one of the manners, or may be, for another example, a combination of two or more manners.

In some examples, referring to FIG. 7, the second blocking layer 51 in the plurality of second blocking layers 51 farthest from the substrate 1 covers the side surface, facing the first dam 4, of the second blocking layer 51 in the plurality of second blocking layers 51 second farthest from the substrate 1.

In some other examples, referring to FIG. 8, the second blocking layer 51 in the plurality of second blocking layers 51 second farthest from the substrate 1 covers the side surface, facing the first dam 4, of the second blocking layer 51 in the plurality of second blocking layers 51 third farthest from the substrate 1.

In yet other examples, referring to FIG. 9, the second blocking layer 51 in the plurality of second blocking layers 51 third farthest from the substrate 1 covers the side surface, facing the first dam 4, of the second blocking layer 51 in the plurality of second blocking layers 51 fourth farthest from the substrate 1.

In yet other examples, referring to FIG. 10, the second blocking layer 51 in the plurality of second blocking layers 51 second farthest from the substrate 1 covers the side surface, facing the first dam 4, of the second blocking layer 51 in the plurality of second blocking layers 51 third farthest from the substrate 1. The second blocking layer 51 in the plurality of second blocking layers 51 third farthest from the substrate 1 covers the side surface, facing the first dam 4, of the second blocking layer 51 in the plurality of second blocking layers 51 fourth farthest from the substrate 1.

In yet other examples, referring to FIG. 11, the second blocking layer 51 in the plurality of second blocking layers 51 farthest from the substrate 1 covers the side surface, facing the first dam 4, of the second blocking layer 51 in the plurality of second blocking layers 51 second farthest from the substrate 1. The second blocking layer 51 in the plurality of second blocking layers 51 second farthest from the substrate 1 covers the side surface, facing the first dam 4, of the second blocking layer 51 in the plurality of second blocking layers 51 third farthest from the substrate 1. The second blocking layer 51 in the plurality of second blocking layers 51 third farthest from the substrate 1 covers the side surface, facing the first dam 4, of the second blocking layer 51 in the plurality of second blocking layers 51 fourth farthest from the substrate 1.

Figure 12:
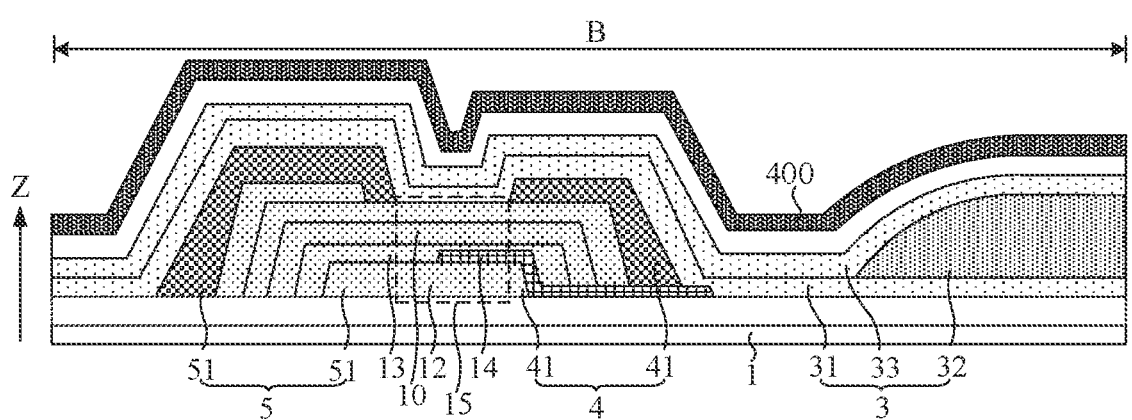
FIG. 12 is a partial structural diagram of yet another display substrate, in accordance with some embodiments of the present disclosure.

In some embodiments, referring to FIG. 12, a first blocking layer 41 in the plurality of first blocking layers 41 closest to the substrate 1 is connected to a second blocking layer 51 closest to the substrate 1 through a connection layer 10, so as to form a first communication portion 12. A first blocking layer 41 second closest to the substrate 1 is connected to a second blocking layer 51 second closest to the substrate 1 through a connection layer 10, so as to form a second communication portion 13.

The display substrate 100 further includes a voltage signal line 14 disposed on the side of the substrate 1. The voltage signal line 14 is located in the peripheral region B, and is arranged around the display region A.

A portion of the voltage signal line 14 away from the display region A is located between the first communication portion 12 and the second communication portion 13. An orthographic projection of an edge of the voltage signal line 14 away from the display region A on the substrate 1 is located between an orthographic projection of an edge of the first communication portion 12 proximate to the display region A on the substrate 1 and an orthographic projection of an edge of the first communication portion 12 away from the display region A on the substrate 1.

It will be noted that since the first communication portion 12 is an organic insulating layer, and the voltage signal line 14 is a metal layer, in some of the above examples, the voltage signal line 14 is controlled to cover only part of the first communication portion 12, so that water vapor generated by the organic insulating layer is able to be prevented from being blocked by the metal layer, and is able to smoothly escape. On this basis, even if an amount of the generated water vapor increases with time, an accumulated amount of the water vapor does not increase significantly, so that the voltage signal line 14 is prevented from being lifted up due to an excessive accumulated amount of the water vapor. That is, peeling is prevented from occurring in the display substrate 100.

Figure 13:
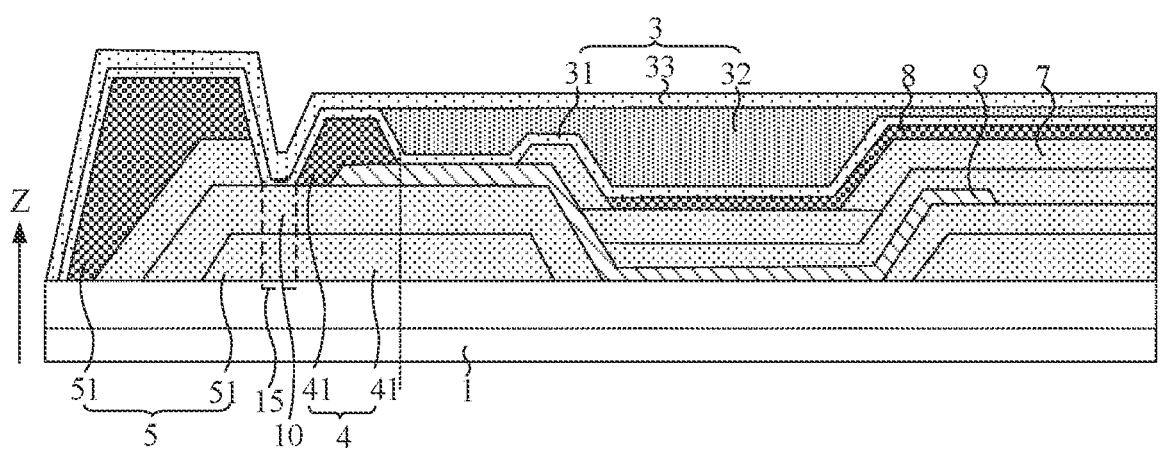
FIG. 13 is a partial structural diagram of yet another display substrate, in accordance with some embodiments of the present disclosure.

In some embodiments, referring to FIG. 13, the display substrate further includes a barrier layer 9.

In some examples, an end of the barrier layer 9 extends between two adjacent first blocking layers 41, and another end of the barrier layer 9 extends between two adjacent planarization layers 7. Moreover, the first blocking layer 41 on which the end of the barrier layer 9 is lapped is arranged in a same layer as the planarization layer 7 on which the another end of the barrier layer 9 is lapped.

It will be noted that since films are sequentially formed in order in a process of forming the display substrate 100, i.e., a previously formed film is proximate to the substrate 1, and a subsequently formed film is away from the substrate 1, the barrier layer 9 is formed later than the first blocking layer 41 and the planarization layer 7 on which the barrier layer 9 is lapped.

In some of the above examples, the barrier layer 9 is provided, so that a level difference between the first dam 4 and the plurality of planarization layers 7 may be reduced by using the barrier layer 9 to reduce a change rate of the level difference, and the first first blocking layer 41 and a first planarization layer 7 (i.e., the first planarization layer 71) may be separated by using the barrier layer 9 to avoid a water-oxygen passageway due to a contact between the first first blocking layers 41 and the first planarization layer 7. Thus, the water vapor is prevented from entering the display region A, which is beneficial to improving a capability to block the water vapor, so as to avoid an encapsulation failure due to the water vapor entering the display region A.

In some examples, the barrier layer 9 is arranged in a same layer as one of the conductive line layer(s) 6.

That is, in a case where there is a single conductive line layer 6, the barrier layer 9 may be arranged in a same layer as the conductive line layer 6. In a case where there are a plurality of conductive line layers 6, the barrier layer 9 may be arranged in a same layer as one of the conductive line layers 6. This is beneficial to simplifying a manufacturing method of the display substrate 100.

In some examples, referring to FIG. 13 again, an orthographic projection of the first blocking layer 41 in the plurality of first blocking layers 41 farthest from the substrate 1 on the substrate 1 is located within an orthographic projection of the first blocking layer 41 in the plurality of first blocking layers 41 second farthest from the substrate 1 on the substrate 1. In this case, an area of the orthographic projection of the first blocking layer 41 farthest from the substrate 1 on the substrate 1 is less than an area of the orthographic projection of the first blocking layer 41 second farthest from the substrate 1 on the substrate 1. The first blocking layer 41 farthest from the substrate 1 covers only part of the first blocking layer 41 second farthest from the substrate 1.

In some examples, an orthographic projection, on the substrate 1 of the first blocking layer 41 on which the end of the barrier layer 9 is lapped and an orthographic projection, on the substrate 1, of the planarization layer 7 located on a side of the another end of the barrier layer 9 away from the substrate 1 are overlapped with each other, or have respective edges that are overlapped with each other. In this design, it is possible to make a level difference between films included in the display substrate 100 in a transition region between the peripheral region B and the display region A small, so as to ensure a yield of the subsequently formed signal transmission line 400.

In some embodiments, a structure of the touch grid structure 200 in the display apparatus 1000 may vary, and may be set according to actual needs.

For example, referring to FIG. 2, the touch grid structure 200 may include a plurality of conductive bridges 2112 arranged in an array and a plurality of rows of first touch sub-electrodes 2111. Each row of first touch sub-electrodes 2111 may include, for example, a plurality of first touch sub-electrodes 2111 arranged at intervals in a first direction X. In each row of first touch sub-electrodes, every two adjacent first touch sub-electrodes 2111 are electrically connected to a conductive bridge 2112 through respective via holes, so that the plurality of rows of first touch sub-electrodes 2111 and the plurality of conductive bridges 2112 constitute a plurality of first touch electrodes 211.

For example, referring to FIG. 2 again, the touch grid structure 200 may further include a plurality of second touch electrodes 212 extending in a second direction Y. Each second touch electrode 212 may include, for example, a plurality of second touch sub-electrodes 2121 connected in series. For example, each second touch electrode 212 is of an integrative structure.

For example, referring to FIG. 2 again, each first touch electrode 211 is electrically connected to the touch driver chip 300 through a signal transmission line 400, and each second touch electrode 212 is electrically connected to the touch driver chip 300 through a signal transmission line 400.

For example, the signal transmission lines 400 included in the display apparatus 1000 may be arranged in a same layer as the conductive bridges 2112. This design is beneficial to simplifying the manufacturing process of the display apparatus 1000.

It will be noted that the display apparatus 1000 may be, for example, any product or component with a display function, such as a mobile phone, a tablet computer, a television, a display, a notebook computer, a digital photo frame, or a navigator.

Figure 15:
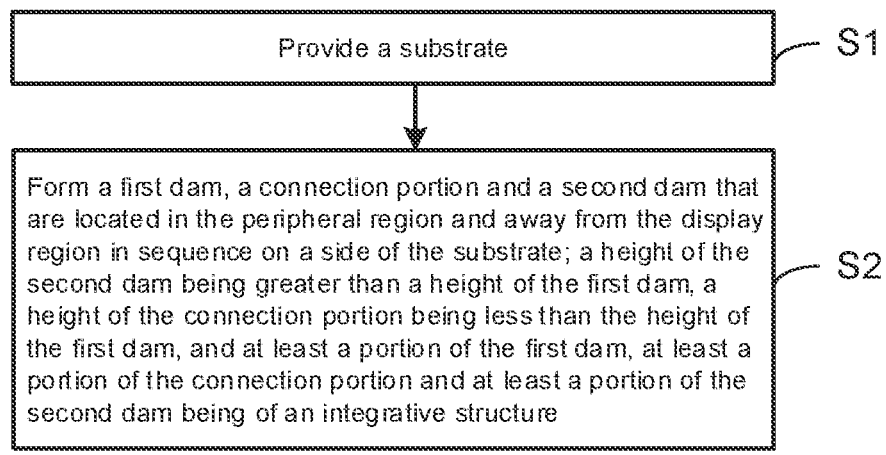
FIG. 15 is a flow diagram of a manufacturing method of a display substrate, in accordance with some embodiments of the present disclosure.

Some embodiments of the present disclosure further provide a manufacturing method of the display substrate 100 in any one of the above embodiments. Referring to FIG. 15, the manufacturing method includes S1 and S2.

In S1, the substrate 1 is provided.

In S2, the first dam 4, the connection portion 15 and the second dam 5 that are located in the peripheral region B and are away from the display region A in sequence are formed on the side of the substrate 1. The height of the second dam 5 is greater than the height of the first dam 4. The height of the connection portion 15 is less than the height of the first dam 4. At least a portion of the first dam 4, at least a portion of the connection portion 15 and at least a portion of the second dam 5 are of an integrative structure.

In some examples, the first dam 4 includes the plurality of first blocking layers 41 that are stacked in sequence, and the second dam 5 includes the plurality of second blocking layers 51 that are stacked in sequence. The total number of the second blocking layers 51 is greater than the total number of the first blocking layers 41.

The connection portion 15 includes the at least one connection layer 10, and the total number of the connection layer(s) 10 is less than the total number of the first blocking layers 41. At least one of the plurality of first blocking layers 41 proximate to the substrate 1 and at least one of the plurality of second blocking layers 51 proximate to the substrate 1 are connected through the at least one connection layer 10.

A connection layer 10 connects a first blocking layer 41 and a second blocking layer 51. For example, the connection layer 10, and the first blocking layer 41 and the second blocking layer 51 that are connected to the connection layer 10 may be formed through a same patterning process.

The manufacturing method of the display substrate 100 in the above embodiments is used for manufacturing the display substrate 100 provided in any one of the above embodiments. The display substrate 100 manufactured by using the manufacturing method has same beneficial effects as the display substrate 100 in any one of the above embodiments, which will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display region and a peripheral region, the display substrate comprising:
   a substrate;
   a first dam and a second dam that are located on a side of the substrate and located in the peripheral region; wherein the second dam is farther from the display region than the first dam, and a height of the second dam is greater than a height of the first dam; and
   a connection portion located between the first dam and the second dam, wherein the connection portion connects the first dam and the second dam; and a height of the connection portion is less than the height of the first dam; wherein
   at least a portion of the first dam, at least a portion of the connection portion and at least a portion of the second dam are of an integrative structure; and
   the first dam includes a plurality of first blocking layers that are stacked in sequence, and the second dam includes a plurality of second blocking layers that are stacked in sequence; and a total number of the second blocking layers is greater than a total number of the first blocking layers; and the connection portion includes one or more connection layers; and a total number of the one or more connection layers is less than the total number of the first blocking layers; or
   the first dam includes a plurality of first blocking layers that are stacked in sequence, the second dam includes a plurality of second blocking layers that are stacked in sequence, and a total number of the second blocking layers is greater than a total number of the first blocking layers; the connection portion includes one or more connection layers, and a total number of the one or more connection layers is less than the total number of the first blocking layers; and at least one of the plurality of first blocking layers proximate to the substrate and at least one of the plurality, of second blocking layers proximate to the substrate are connected through at least one connection layer.

2. The display substrate according to claim 1, wherein a connection layer in the one or more connection layers connects a first blocking layer in the plurality of first blocking layers and a second blocking layer in the plurality of second blocking layers.

3. The display substrate according to claim 1, wherein a side wall of the first dam proximate to the display region has a side proximate to the substrate and a side away from the substrate that is farther from the display region than the side proximate to the substrate, and the side wall is in one of a slope shape and a step shape; and a portion, unconnected to the connection portion, of a side wall of the first dam away from the display region has a side proximate to the substrate and a side away from the substrate that is closer to the display region than the side proximate to the substrate, and the portion is in one of a slope shape and a step shape; and/or a portion, unconnected to the connection portion, of a side wall of the second dam proximate to the display region has a side proximate to the substrate and a side away from the substrate that is farther from the display region than the side proximate to the substrate, and the portion is in one of a slope shape and a step shape; and a side wall of the second dam away from the display region has a side proximate to the substrate and a side away from the substrate that is closer to the display region than the side proximate to the substrate, and the side wall is in one of a slope shape and a step shape.

4. The display substrate according to claim 1, wherein
a slope of a portion, unconnected to the connection portion, of a side wall of the first dam away from the display region is less than a slope of a portion, unconnected to the connection portion, of a side wall of the second dam proximate to the display region; and/or
a slope of a side wall of the first dam proximate to the display region is less than a slope of a side wall of the second dam away from the display region.

5. A display substrate having a display region and a peripheral region, the display substrate comprising:
a substrate;
a first dam and a second dam that are located on a side of the substrate and located in the peripheral region; wherein the second dam is farther from the display region than the first dam, and a height of the second dam is greater than a height of the first dam; and
a connection portion located between the first dam and the second dam, wherein the connection portion connects the first dam and the second dam, and a height of the connection portion is less than the height of the first dam: wherein
at least a portion of the first dam, at least a portion of the connection portion and at least a portion of the second dam are of an integrative structure;
the display region includes a main display region and an auxiliary display region;
a light transmittance of a portion of the display substrate located in the auxiliary display region is greater than a light transmittance of a portion of the display substrate located in the main display region; and
the display substrate further comprises a plurality of first sub-pixels and a plurality of second sub-pixels that are all disposed on the side of the substrate; wherein the plurality of first sub-pixels are located in the main display region, and each second sub-pixel includes a pixel driving circuit and a light-emitting device disposed on a side of the pixel driving circuit away from the substrate, the light-emitting device is located in the auxiliary display region and coupled to the pixel driving circuit; and at least one pixel driving circuit in the plurality of second sub-pixels is located outside the auxiliary display region.

6. The display substrate according to claim 5, further comprising:
a plurality of planarization layers disposed between the pixel driving circuit and the light-emitting device and stacked in sequence; wherein
at least one first blocking layer in the plurality of first blocking layers other than one or two first blocking layers farthest from the substrate each is arranged in a same layer as a respective planarization layer in part of the plurality of planarization layers; and/or
second blocking layers in the plurality of second blocking layers other than one or two second blocking layers farthest from the substrate each are arranged in another same layer as a respective planarization layer in all of the plurality of planarization layers.

7. The display substrate according to claim 6, further comprising at least one conductive line layer including at least one light-transmitting conductive line; a pixel driving circuit in the at least one pixel driving circuit located in the peripheral region being coupled to a corresponding light-emitting device through a light-transmitting conductive line; wherein at least one of the planarization layers is disposed between the entire at least one conductive line layer and the pixel driving circuit in each second sub-pixel; and another at least one of the planarization layers is disposed between the entire at least one conductive line layer and the light-emitting device; or
the display substrate further comprising at least one conductive line layer including at least one light-transmitting conductive line; a pixel driving circuit in the at least one pixel driving circuit located in the peripheral region being coupled to a corresponding light-emitting device through a light-transmitting conductive line; wherein at least one of the planarization layers is disposed between the entire at least one conductive line layer and the pixel driving circuit in each second sub-pixel; another at least one of the planarization layers is disposed between the entire at least one conductive line layer and the light-emitting device; and the at least one conductive line layer includes at least two conductive line layers, and yet another at least one of the planarization layers is disposed between two adjacent conductive line layers.

8. The display substrate according to claim 7, wherein
the planarization layer between the entire at least one conductive line layer and the pixel driving circuit in each second sub-pixel includes at least one first planarization layer; wherein
the first planarization layer includes one first planarization layer, the plurality of first blocking layers include a first first blocking layer arranged in a same layer as the first planarization layer, the plurality of second blocking layers include a first second blocking layer arranged in the same layer as the first planarization layer, and the at least one connection layer includes a first connection layer; and the first connection layer connects the first first blocking layer and the first second blocking layer; or
the first planarization layer includes two first planarization layers, the plurality of first blocking layers include a first first blocking layer arranged in a same layer as one first planarization layer of the two first planarization layers and a second first blocking layer arranged in another same layer as another first planarization layer of the two first planarization layers, the plurality of second blocking layers include a first second blocking layer arranged in the same layer as the one first planarization layer and a second second blocking layer arranged in the another same layer as the another first planarization layer, and the at least one connection layer includes a first connection layer and a second connection layer; and the first connection layer connects the first first blocking layer and the first second blocking layer, and the second connection layer connects the second first blocking layer and the second second blocking layer.

9. The display substrate according to claim 8, wherein
the first planarization layer includes the two first planarization layers;

the at least one conductive line layer includes three conductive line layers; a planarization layer in the plurality of planarization layers is disposed between two adjacent conductive line layers of the three conductive line layers proximate to the substrate, and is a first second planarization layer; and another planarization layer in the plurality of planarization layers is disposed between two adjacent conductive line layers of the three conductive line layers away from the substrate, and is a second second planarization layer;

the plurality of first blocking layers further include a third first blocking layer arranged in yet another same layer as the first second planarization layer, and a fourth first blocking layer arranged in yet another same layer as the second second planarization layer; and the plurality of second blocking layers further include a third second blocking layer arranged in the yet another same layer as the first second planarization layer, and a fourth second blocking layer arranged in the yet another same layer as the second second planarization layer; wherein the at least one connection layer further includes a third connection layer and a fourth connection layer; and the third connection layer connects the third first blocking layer and the third second blocking layer, and the fourth connection layer connects the fourth first blocking layer and the fourth second blocking layer; or the at least one connection layer further includes a third connection layer, and the third connection layer connects the third first blocking layer and the third second blocking layer; and the fourth first blocking layer is unconnected to the fourth second blocking layer.

10. The display substrate according to claim 9, further comprising: a pixel defining layer disposed on a side of the plurality of planarization layers away from the substrate; and a plurality of support pads disposed on a surface of the pixel defining layer away from the substrate; wherein a first blocking layer in the plurality of first blocking layers farthest from the substrate is arranged in a same layer as the pixel defining layer, and a second blocking layer in the plurality of second blocking layers farthest from the substrate is arranged in the same layer as the pixel defining layer or arranged in another same layer as the plurality of support pads; or a first blocking layer in the plurality of first blocking layers farthest from the substrate is arranged in a same layer as the plurality of support pads, and a second blocking layer in the plurality of second blocking layers farthest from the substrate is arranged in the same layer as the plurality of support pads or arranged in another same layer as the pixel defining layer; or the display substrate further comprising: a pixel defining layer disposed on a side of the plurality of planarization layers away from the substrate; and a plurality of support pads disposed on a surface of the pixel defining layer away from the substrate; wherein a first blocking layer in the plurality of first blocking layers farthest from the substrate is arranged in a same layer as the plurality of support pads, and a first blocking layer in the plurality of first blocking layers second farthest from the substrate is arranged in a same layer as the pixel defining layer; and a second blocking layer in the plurality of second blocking layers farthest from the substrate is arranged in the same layer as the plurality of support pads, and a second blocking layer in the plurality of second blocking layers second farthest from the substrate is arranged in the same layer as the pixel defining layer.

11. The display substrate according to claim 10, wherein the plurality of first blocking layers further include a fifth first blocking layer arranged in the same layer as the pixel defining layer or the plurality of support pads;

the planarization layer between the entire at least one conductive line layer and the light-emitting device includes at least one third planarization layer, and the third planarization layer includes one third planarization layer; and the plurality of second blocking layers further include a fifth second blocking layer arranged in yet another same layer as the third planarization layer, and a sixth second blocking layer arranged in the same layer as the pixel defining layer or the plurality of support pads; wherein the fifth second blocking layer and the sixth second blocking layer are unconnected to the fifth first blocking layer.

12. The display substrate according to claim 6, further comprising: a barrier layer, an end of the barrier layer extending between two adjacent first blocking layers, and another end of the barrier layer extending between two adjacent planarization layers; wherein a first blocking layer in the two adjacent first blocking layers on which the end of the barrier layer is lapped is arranged in a same layer as a planarization layer in the two adjacent planarization layers on which the another end of the barrier layer is lapped; or the display substrate further comprising: a barrier layer, an end of the barrier layer extending between two adjacent first blocking layers, and another end of the barrier layer extending between two adjacent planarization layers; wherein a first blocking layer in the two adjacent first blocking layers on which the end of the barrier layer is lapped is arranged in a same layer as a planarization layer in the two adjacent planarization layers on which the another end of the barrier layer is lapped; and an orthographic projection, on the substrate, of the first blocking layer on which the end of the barrier layer is lapped and an orthographic projection, on the substrate, of another planarization layer in the two adjacent planarization layers located on a side of the another end of the barrier layer away from the substrate are overlapped with each other, or have respective edges that are overlapped with each other.

13. The display substrate according to claim 12, wherein the display substrate further comprises at least one conductive line layer, and the barrier layer is arranged in a same layer as one of the at least one conductive line layer.

14. The display substrate according to claim 5, further comprising:

an encapsulation layer disposed on a side of the plurality of first sub-pixels and the plurality of second sub-pixels away from the substrate; the encapsulation layer being configured to encapsulate the plurality of first sub-pixels and the plurality of second sub-pixels on the substrate; wherein the encapsulation layer includes:
a first inorganic layer;
an organic layer disposed on a side of the first inorganic layer away from the substrate; and
a second inorganic layer disposed on a side of the organic layer away from the substrate; wherein the second dam is configured to confine the organic layer to a region surrounded thereby; and the first inorganic layer covers the first dam and the second dam, and the second inorganic layer covers the first dam and the second dam.

15. The display substrate according to claim 1, wherein the at least one connection layer includes a plurality of connection layers; a first blocking layer in the plurality of first blocking layers closest to the substrate and a second blocking layer in the plurality of second blocking layers closest to the substrate are connected through a connection layer in the plurality of connection layers to form a first communication portion, a first blocking layer in the plurality of first blocking layers second closest to the substrate and a second blocking layer in the plurality of second blocking layers second closest to the substrate are connected through another connection layer in the plurality of connection layers to form a second communication portion;

the display substrate further comprises:

a voltage signal line disposed on the side of the substrate, the voltage signal line being located in the peripheral region and arranged around the display region; wherein a portion of the voltage signal line away from the display region is located between the first communication portion and the second communication portion, and an orthographic projection of an edge of the voltage signal line away from the display region on the substrate is located between an orthographic projection of an edge of the first communication portion proximate to the display region on the substrate and an orthographic projection of an edge of the first communication portion away from the display region on the substrate.

16. The display substrate according to claim 1, wherein the plurality of first blocking layers are arranged in at least one of following manners: a first blocking layer in the plurality of first blocking layers farthest from the substrate covers a side surface, facing the second dam, of a first blocking layer in the plurality of first blocking layers second farthest from the substrate; or the first blocking layer in the plurality of first blocking layers second farthest from the substrate covers a side surface, facing the second dam, of a first blocking layer in the plurality of first blocking layers third farthest from the substrate; and/or the plurality of second blocking layers are arranged in at least one of following manners: a second blocking layer in the plurality of second blocking layers farthest from the substrate covers a side surface, facing the first dam, of a second blocking layer in the plurality of second blocking layers second farthest from the substrate; or the second blocking layer in the plurality of second blocking layers second farthest from the substrate covers a side surface, facing the first dam, of a second blocking layer in the plurality of second blocking layers third farthest from the substrate; or the second blocking layer in the plurality of second blocking layers third farthest from the substrate covers a side surface, facing the first dam, of a second blocking layer in the plurality of second blocking layers fourth farthest from the substrate; and/or a connection layer in the one or more connection layers is arranged in a same layer as a first blocking layer in the plurality of first blocking layers and a second blocking layer in the plurality of second blocking layers that are connected to the connection layer.

17. A manufacturing method of a display substrate, the display substrate having a display region and a peripheral region; the manufacturing method comprising:

providing a substrate; and forming a first dam, a connection portion and a second dam that are located in the peripheral region and away from the display region in sequence on a side of the substrate;

wherein a height of the second dam is greater than a height of the first dam; a height of the connection portion is less than the height of the first dam; and at least a portion of the first dam, at least a portion of the connection portion and at least a portion of the second dam are of an integrative structure;

wherein the first dam includes a plurality of first blocking layers that are stacked in sequence, and the second dam includes a plurality of second blocking layers that are stacked in sequence; and a total number of the second blocking layers is greater than a total number of the first blocking layers;

the connection portion includes one or more connection layers; and a total number of the one or more connection layers is less than the total number of the first blocking layers; and at least one of the plurality of first blocking layers proximate to the substrate and at least one of the plurality of second blocking layers proximate to the substrate are connected through at least one connection layer;

wherein a connection layer in the one or more connection layers connects a first blocking layer in the plurality of first blocking layers and a second blocking layer in the plurality of second blocking layers, and the connection layer, and the first blocking layer and the second blocking layer that are connected to the connection layer are formed through a same patterning process.

18. A display apparatus comprising the display substrate according to claim 1, wherein the peripheral region of the display substrate includes a bonding region located on a side of the second dam away from the display region;

the display apparatus further comprising:

a touch driver chip located in the bonding region of the display substrate;

a touch grid structure located in the display region of the display substrate; and a plurality of signal transmission lines connecting the touch driver chip and the touch grid structure; wherein the plurality of signal transmission lines are located on a side of the first dam and the second dam away from the substrate, and orthographic projections of the plurality of signal transmission lines on the substrate are each partially overlapped with an orthographic projection of the connection portion on the substrate.

* * * * *